(12) United States Patent
Pagnanelli

(10) Patent No.: US 9,391,656 B2
(45) Date of Patent: Jul. 12, 2016

(54) DISTRIBUTED NOISE SHAPING APPARATUS

(71) Applicant: Syntropy Systems, LLC, Huntington Beach, CA (US)

(72) Inventor: Christopher Pagnanelli, Huntington Beach, CA (US)

(73) Assignee: Syntropy Systems, LLC, Huntington Beach, CA (US)

( * ) Notice: Subject to any disclaimer, the term of this patent is extended or adjusted under 35 U.S.C. 154(b) by 0 days.

(21) Appl. No.: 14/810,105

(22) Filed: Jul. 27, 2015

(65) Prior Publication Data

US 2016/0043758 A1 Feb. 11, 2016

Related U.S. Application Data

(60) Provisional application No. 62/095,332, filed on Dec. 22, 2014, provisional application No. 62/035,550, filed on Aug. 11, 2014.

(51) Int. Cl.
*H04B 1/10* (2006.01)
*H04B 1/12* (2006.01)

(52) U.S. Cl.
CPC .............. *H04B 1/1081* (2013.01); *H04B 1/126* (2013.01)

(58) Field of Classification Search
CPC ... H03M 1/0854; H03M 7/3022; H03M 7/30; H03M 11/02; H03M 11/1243
See application file for complete search history.

(56) References Cited

U.S. PATENT DOCUMENTS

| | | | | |
|---|---|---|---|---|
| 4,769,618 | A | 9/1988 | Parish et al. | |
| 6,032,048 | A * | 2/2000 | Hartless | H04B 1/1081 455/296 |
| 7,280,063 | B2 * | 10/2007 | Ozalevli | H03M 1/808 341/118 |
| 2002/0024385 | A1 * | 2/2002 | Korn | H03M 1/183 330/282 |
| 2004/0017854 | A1 * | 1/2004 | Hansen | H03M 7/3006 375/243 |
| 2004/0174220 | A1 | 9/2004 | Toncich et al. | |
| 2005/0254573 | A1 * | 11/2005 | Midya | H03F 1/26 375/238 |
| 2006/0055485 | A1 | 3/2006 | Lobeek | |
| 2006/0202754 | A1 | 9/2006 | Yamamura et al. | |
| 2007/0024480 | A1 * | 2/2007 | Schwoerer | H03H 11/12 341/144 |

OTHER PUBLICATIONS

Jun-Chau Chien and Liang-Hung Lu, "40-Gb/s High-Gain Distributed Amplifiers With Cascaded Gain Stages in 0.18 m CMOS," IEEE Journal of Solid-State Circuits, vol. 42, No. 12, Dec. 2007, pp. 2715-2725.
International Search Report and Written Opinion from corresponding PCT Application No. PCT/US15/42727, Oct. 23, 2015.

* cited by examiner

*Primary Examiner* — Syed Haider
(74) *Attorney, Agent, or Firm* — Joseph G. Swan, P.C.

(57) ABSTRACT

Provided are, among other things, systems, apparatuses methods and techniques for attenuating the level of unwanted noise and/or distortion in a particular frequency band, without similarly attenuating the level of a desired signal in the same frequency band. One such apparatus includes a distributed network comprising a plurality of reactive impedance segments and gain cells that form transmission paths, over which continuous and quantized versions of an input signal propagate before combining with the input signal itself.

20 Claims, 19 Drawing Sheets

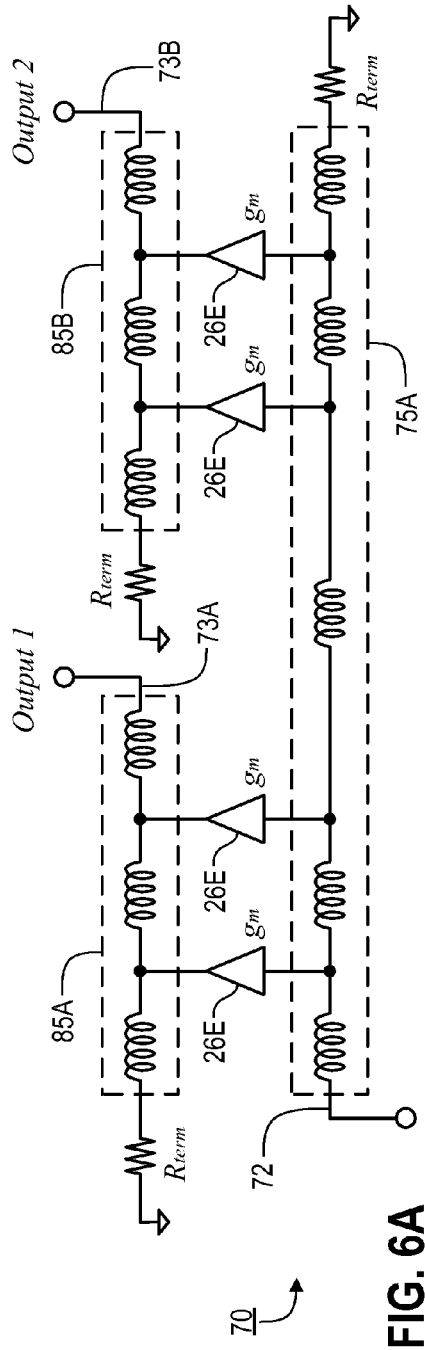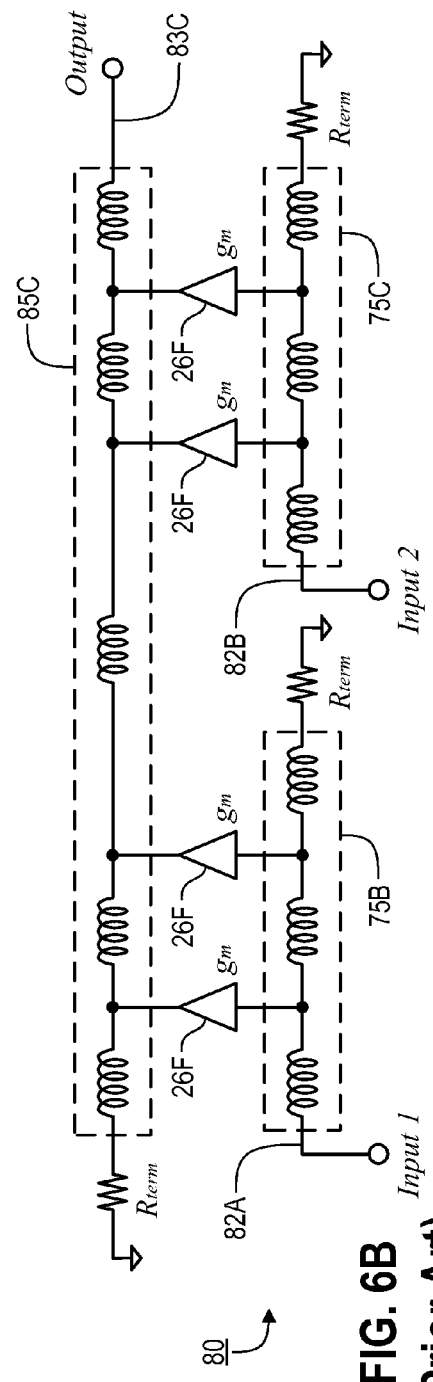
FIG. 6A (Prior Art)
FIG. 6B (Prior Art)

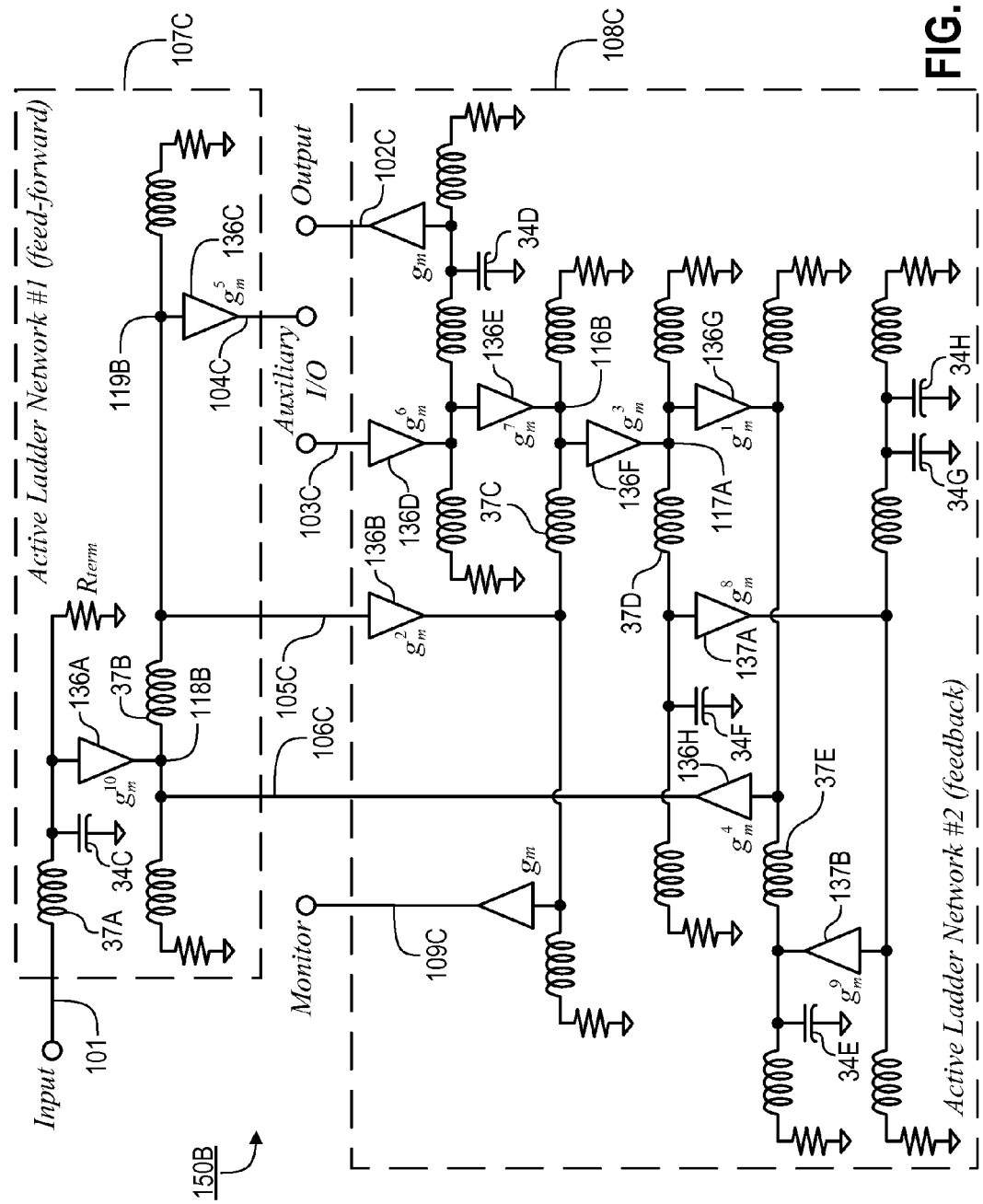

DISTRIBUTED NOISE SHAPING APPARATUS

This application claims the benefit of U.S. Provisional Patent Application Ser. No. 62/035,550, filed on Aug. 11, 2014, and U.S. Provisional Patent Application Ser. No. 62/095,332, filed on Dec. 22, 2014, which applications are incorporated by reference herein as though set forth herein in full.

FIELD OF THE INVENTION

The present invention pertains to systems, apparatuses, methods and techniques for attenuating the level of unwanted noise and distortion in a particular frequency band, without similarly attenuating the level of a desired signal in the same frequency band.

BACKGROUND

Conventionally, the process of using feedback to attenuate the level of additive noise and distortion in a particular frequency band, without attenuating the level of a signal in the same frequency band, is referred to as noise shaping. Use of feedback to combine a corrupted output signal (i.e., an impaired output signal) with an input reference signal, followed by subsequent processing, causes unwanted signal impairments to be filtered with one transfer function (i.e., a noise-transfer-function) while a desired input signal is filtered with a different transfer function (i.e., a signal-transfer-function). In effect, noise and distortion are shifted (i.e., shaped by the noise-transfer-function) into frequencies that lie outside the band of an input signal (e.g., the band determined by the single-transfer-function). The processing that produces this noise-shaped response is sometimes referred to as modulation, and the circuitry associated with this processing, is sometimes referred to as a modulator. Common instantiations of noise shaping include phase-locked loops (PLLs) for frequency synthesis, and delta-sigma ($\Delta\Sigma$) modulators for data conversion.

Circuit 10A, illustrated in FIG. 1A, is an exemplary PLL of the type conventionally used for shaping the phase noise which corrupts the output of a voltage-controlled oscillator (VCO). The PLL of circuit 10A produces an output signal (i.e., a version of the input signal) with a frequency ($f_{OUT}$) that is N times greater than the frequency ($f_{REF}$), where N is an integer determined by the operation of a frequency divider in the feedback path (e.g., frequency divider 15). In circuit 10A, the phase variation (noise) at the output 3A of VCO 13 is fed back to phase detector 7A (e.g., as signal 6A from frequency divider 15), where it is combined with reference input 1A. Second-order integration within loop filter 9A (i.e., including implicit frequency-phase integrator 21), results in a (phase) noise-transfer-function $H_{NTF}$ (i.e., the transfer function to output 3A of PLL 10A, from a virtual point of noise addition within VCO 13) which is of the form $$H_{NTF}(s) = \frac{s^2}{s^2 + 2\zeta\omega_n \cdot s + \omega_n^2},$$

where the coefficients of loop filter 9A determine the natural frequency $\omega_n$ and the damping factor $\zeta$ of the PLL. A typical plot of the noise-transfer-function (NTF) for a conventional PLL (e.g., circuit 10A) is curve 31 of FIG. 1B. As illustrated in FIG. 1B, the phase noise of the VCO is shaped with a high-pass response, such that phase noise is attenuated at frequencies less than $\omega_n$. In contrast, the same processing results in a signal-transfer-function $H_{STF}$, from input 2 of the PLL to output 3A of the PLL, which is of the form $$H_{STF}(s) = \frac{2\zeta\omega_n \cdot s + \omega_n^2}{s^2 + 2\zeta\omega_n \cdot s + \omega_n^2}.$$

The signal-transfer-function (STF) for circuit 10A produces a low-pass response, such as curve 32 of FIG. 1B. At the output of the PLL, therefore, noise shaping causes the phase variation (i.e., noise) of the VCO to be filtered with one transfer function (i.e., a high-pass response), and the phase variation (i.e., signal) of the reference input to be filtered with a different transfer function (i.e., a low-pass response).

Conventional delta-sigma modulators are circuits 10B&C, which are illustrated in FIGS. 2A&B, respectively. Modulators 10B&C operate on continuous-time input signals, and therefore, are referred to as continuous-time delta-sigma (CT-$\Delta\Sigma$) modulators. Conventional CT-$\Delta\Sigma$ modulators produce a coarsely quantized version (e.g., digital signals 3B&C) of a continuous-time input signal (e.g., analog signal 1B), using a sampling rate which is many times the bandwidth of the input signal (i.e., the input signal is oversampled). As shown in FIGS. 2A&B, conventional CT-$\Delta\Sigma$ modulators include: 1) an input combining operation (e.g., within subtractor 7B); 2) an integration function of second-order (e.g., within loop filter 9B&C); 3) a rounding/truncation function (e.g., within quantizer 14); and 4) a feedback digital-to-analog (D/A) conversion function (e.g., within D/A converter 17). A variation of the CT-$\Delta\Sigma$ modulator is the discrete-time delta-sigma (DT-$\Delta\Sigma$) modulator, which includes a sample-and-hold function at the modulator input, such that the modulator operates on discrete-time signals. Referring to FIGS. 2A&B, modulators 10B&C produce a (quantization) noise-transfer-function $H_{NTF}$ (i.e., a transfer function to outputs 3B&C of modulators 10B&C, from a virtual point of noise addition within quantizer 14) which is of the form $$H_{NTF}(s) = \frac{s^2}{s^2 + 2\zeta\omega_n \cdot s + \omega_n^2},$$

and produce a signal-transfer-function $H_{STF}$ (i.e., a transfer function from input 1B to outputs 3B&C of modulators 10B&C) which is of the form $$H_{STF}(s) = \frac{\omega_n^2}{s^2 + 2\zeta\omega_n \cdot s + \omega_n^2}.$$

The NTF produces a frequency response which is high-pass and similar to curve 31 shown in FIG. 1B, while the STF produces a frequency response that is low-pass and similar to curve 32 shown in FIG. 1B. Instead of attenuating low-frequency phase noise that is introduced at the output of a VCO, conventional $\Delta\Sigma$ modulators attenuate low-frequency quantization noise that is introduced by a coarse quantization operation (i.e., noise from quantizer 14).

An alternative to the conventional $\Delta\Sigma$ modulator is the Diplexing Feedback Loop (DPL) circuit 10D, shown in FIG. 2C. Like a conventional $\Delta\Sigma$ modulator, DPL circuit 10D produces an oversampled and coarsely quantized version of a continuous-time input signal (e.g., analog signal 1B), such that the quantization noise introduced by the coarse quantization operation (e.g., noise from quantizer 14), is attenuated in a frequency band occupied by input signal 1B. Also, the DPL is similar to a conventional ΔΣ modulator in that it does not appreciably attenuate the input signal itself. Rather than connecting the output of a combining operation (e.g., adder 7C) to the input of a coarse quantization operation (e.g., quantizer) through a loop filter (i.e., through integrators in a feed-forward path), however, the DPL shapes noise by feeding back a signal (i.e., signal 6D) which is generated through a linear combination of: 1) a filtered version of the quantizer input (i.e., quantizer input signal 4D at node 19); and 2) a filtered version of the quantizer output (i.e., quantizer output 3D). Since the DPL does not rely on active integrators or filtering in a feed-forward path, the DPL has significant performance advantages over a conventional ΔΣ modulator, including: 1) the DPL is better suited for high-frequency operation because there are no active integrators which limit processing bandwidth; and 2) the DPL has an STF which is essentially all-pass because filtering takes place within a feedback path. Referring to the block diagram shown in FIG. 2C, the linearized noise-transfer-function (NTF) of DPL 10D, is of the form $$NTF(s) = \frac{1 + H_1(s) \cdot H_3(s)}{1 + H_1(s) \cdot H_3(s) - H_2(s) \cdot H_3(s)},$$

and it can be shown that for the appropriate choice of filter responses (e.g., $H_1$, $H_2$, and $H_3$), DFL 10D produces a second-order noise-shaped response that is comparable to that of a conventional ΔΣ modulator. More specifically, an appropriate choice for the filter responses is:

$$H_1(s) \cdot H_3(s) = \phi_{00} \cdot W_{00}(s) + \phi_{01} \cdot W_{01}(s)$$

$$H_2(s) \cdot H_3(s) = \phi_{10} \cdot W_{10}(s) + \phi_{11} \cdot W_{11}(s)$$

where $\phi_{ij}$ are positive or negative scalars and $W_{ij}(s)$ are low-pass responses of first to fifth order. The block diagrams of FIGS. 2D&E, illustrate one method by which a second-order DPL structure (e.g., generalized modulator 10E) can be adapted to create a DPL structure which shapes quantization noise according to a fourth-order response (e.g., generalized modulator 10F).

Regardless of the intended application (e.g., the attenuation of phase noise, quantization noise, etc.) or the type of apparatus employed (e.g., PLL, ΔΣ modulator, DFL, etc.), circuits capable of wideband operation are needed for effective noise shaping at high frequencies. The distributed amplifier, shown in FIG. 3A, represents a conventional method used to extend the operating bandwidth of standard amplifier configurations (i.e., amplifiers which employ a standard form of negative feedback). In a standard configuration (e.g., transistors in a common-emitter or common-source configuration), the bandwidth and the gain of an amplifier are inversely related due to the Miller effect, which causes the capacitance of the active device to increase with increasing gain. A distributed amplifier, such as circuit 20 of FIG. 3A, overcomes the problem of gain-dependent bandwidth using a combination of two tactics: 1) to reduce the impact of the Miller effect, the outputs of multiple, low-gain amplifiers (e.g., gain cells 26A) are summed; and 2) to circumvent the problem of additive capacitance, which would otherwise limit bandwidth, the intrinsic capacitances of active devices (e.g., the input or output capacitance of the transconductance elements comprising gain cells 26A) are grouped with discrete inductors (e.g., inductors 33A) to form the reactive impedance segments (e.g., L-sections 27A&B) of an "artificial" transmission line (e.g., input transmission line 25A and output transmission line 35A). The term "artificial" transmission line is conventionally used to describe a ladder network consisting of concatenated inductor-capacitor sections (e.g., L-sections 27A&B), because such a structure approximates the general properties of an actual transmission line (e.g., characteristic impedance, propagation delay, frequency-dependent attenuation, etc.). Conventionally, artificial transmission lines are of the type illustrated by circuits 30A&B of FIGS. 3B&C, respectively. Each of circuits 30A&B is terminated in a characteristic impedance of $R_{term} = \sqrt{L/C_{gm}}$, and comprises L-sections (e.g., L-sections 27C) with series inductance L (e.g., from discrete inductors 33B) and shunt capacitance $C_{gm}$ (e.g., from discrete capacitors 34A). Circuit 30A employs a configuration where the first reactive element is a series inductor with inductance equal to ½·L, and circuit 30B employs a configuration where the first reactive element is a shunt capacitor with capacitance equal to ½·$C_{gm}$. Each L-section of circuits 30A&B, introduces a propagation delay $t_{PD}$ equal to $$t_{PD} = \sqrt{Lc_{gm}},$$

and overall, each circuit produces a low-pass response with a bandwidth that is approximately given by $$BW \approx \frac{1}{\pi \sqrt{LC_{gm}}}.$$

Sometimes, AC-coupling capacitors are added to the artificial transmission line, such that only AC signals are able to propagate from one end of the network to the other.

Referring again to amplifier 20 of FIG. 3A, each of the reactive impedance segments (e.g., L-sections 27A&B) consists of a series inductance (e.g., from discrete inductors 33A), which is coupled at a junction point (e.g., junction points 28A and 38A), to the intrinsic shunt capacitance at the input or output of an active device (i.e., capacitance $C_{gm}$ of artificial transmissions lines 30A&B is provided by the intrinsic capacitance at the input or output of a corresponding gain cell). In amplifier 20, each reactive impedance segment (e.g., L-sections 27A&B) includes a gain (e.g., transconductance) cell, and therefore, the amplifier has a number of distributed stages n (i.e., conventionally defined as the total number of gain cells) which is equal to the total number of reactive impedance segments. Alternatively, some L-sections could comprise discrete capacitors, instead of gain cells, which would make the number of distributed stages less than the total number of reactive impedance segments. The overall bandwidth BW of amplifier 20 is independent of the number of distributed stages n, and is approximately determined by the bandwidth of each L-section according to $$BW \approx \frac{1}{\pi \sqrt{LC_{gm}}},$$

where L is the total inductance associated with each L-section, and $C_{gm}$ is the shunt capacitance associated with each L-section. Furthermore, the overall (voltage) gain $A_V$ of amplifier 20 increases linearly as the number of distributed stages increases, according to $$A_V = \frac{1}{2} \cdot n \cdot g_m \cdot R_{term},$$

where: 1) n is the number of distributed stages (i.e., gain cells); 2) $g_m$ is the transconductance associated with each gain cell; and 3) $R_{term} = \sqrt{L/C_{gm}}$ is the terminating resistance for an artificial transmission line. Therefore, the gain of amplifier 20 is independent of bandwidth, and depends only on the number gain cells within the distributed ladder network (i.e., the number of distributed stages). The gain cells associated with the each of the reactive impedance segments typically are implemented using conventional topologies that include: 1) the common-source amplifier of FIG. 4A; 2) the variable-gain cascode of FIG. 4B; 3) the broadband cascode of FIG. 4C; and/or 4) the variable-gain/delay amplifier of FIG. 4D.

Conventional variations of the basic distributed amplifier (e.g., basic amplifier 20 of FIG. 3A) include cascaded distributed amplifier 50 shown in FIG. 5A, and matrix distributed amplifier 60 shown in FIG. 5B. In conventional cascaded and matrix structures, multiple artificial transmission lines are grouped together into a composite arrangement, which provides a higher overall gain for the same number of gain cells. In addition to an input transmission line (e.g., artificial transmission line 25B) and an output transmission line (e.g., artificial transmission line 35B), cascaded distributed amplifier 50 shown in FIG. 5A, also includes an intermediate transmission line (e.g., artificial transmission line 45B). Through gain cells 26B&C, intermediate transmission line 45B provides a coupling path between input transmission line 25B and output transmission line 35B. Due to the coupling of the gain cells in both a distributed arrangement (i.e., the parallel coupling of gain cells 26B across common transmission line 25B, and the parallel coupling of gain cells 26C across common transmission line 35B) and a cascaded arrangement (i.e., series coupling of the outputs of gain cells 26B to the inputs of gain cells 26C across common transmission line 45B), the voltage gain associated with cascaded amplifier 50 is given by $$A_V = \left(\frac{1}{2} \cdot n \cdot g_m \cdot R_{term}\right)^m,$$

where n is the number of distributed stages and m is the number of cascaded stages (e.g., m=2 for amplifier 50). As used herein, the term "distributed stages" refers to those reactive impedance segments which are linked such that: 1) the input of a gain cell associated with one L-section, is coupled in a parallel arrangement, to the input of a gain cell associated with another L-section (e.g., gain cells 26B with inputs coupled via transmission line 25B, or gain cells 26C with inputs coupled via transmission line 45B); or equivalently 2) the output of a gain cell associated with one L-section, is coupled in a parallel arrangement, to the output of a gain cell associated with another L-section (e.g., gain cells 26B with outputs coupled via transmission line 45B, or gain cells 26C with outputs coupled via transmission line 35B). The term "cascaded stages", as used herein, refers to the number of levels through which the gain cells associated with one set of distributed stages (e.g., a first set of parallel L-sections which include gain cells 26B), is coupled in a series arrangement (i.e., inputs to outputs), to the gain cells associated with another set of distributed stages (e.g., a second set of parallel L-sections which include gain cells 26C). Like amplifier 20 of FIG. 5A, the gain of amplifier 50 is independent of bandwidth (i.e., the bandwidth depends only on the inductance and capacitance of the constituent L-sections comprising the network). More specifically, the voltage gain of amplifier 50 increases linearly with the number of distributed stages n (i.e., the number of gain cells in parallel), and increases geometrically with the number of cascaded stages m (i.e., the number of levels through which sets of distributed stages are coupled in series).

Multiple transmission lines can also be coupled via gain cells, into the matrix configuration illustrated in FIG. 5B. Compared to cascaded amplifier 50, matrix amplifier 60 of FIG. 5B, generally utilizes fewer stages to realize a particular voltage gain $A_V$. The maximum shunt capacitance associated with any of the reactive impedance segments (e.g., the maximum shunt capacitance associated with any of L-sections 27E-G), however, is larger for the matrix configuration due to more active devices sharing a common junction point. There is a single active device at each junction point of cascaded amplifier 50 (e.g., a single active device at each of junction points 28B, 38B, and 48B), while for matrix amplifier 60, several junction points share two active devices (e.g., two active devices share each of junction points 29 and 39). Since amplifier bandwidth is inversely proportional to shunt capacitance, matrix amplifier 60 typically would have lower bandwidth than cascaded amplifier 50. Also, matrix amplifier 60 typically would have lower gain per stage than cascaded amplifier 50 because: 1) voltage gain $A_V$ is directly proportional to termination resistance $R_{term}$; and 2) termination resistance $R_{term}$ is inversely proportional to shunt capacitance $C_{gm}$. Therefore, although the matrix configuration offers the potential benefit of fewer stages (i.e., fewer reactive impedance segments), this benefit comes at the expense of lower bandwidth and/or lower gain per stage.

In addition to amplifier circuits, distributed architectures conventionally have been utilized to implement broadband power splitters and broadband power combiners. Conventional power divider 70 shown in FIG. 6A, routes input signal 72 to two different outputs (e.g., outputs 73A&B), using: 1) a single input transmission line (e.g., artificial transmission line 75A); 2) a pair of output transmission lines (e.g., artificial transmission lines 85A&B); and 3) multiple gain cells (e.g., $g_m$ cells 26E). For identical gain cells and identical reactive impedance segments (e.g., L-sections), the ratio by which signal power is divided between the two outputs, depends on the number of stages (i.e., gain cells) associated with one of the output transmission lines relative to the other. Conversely, conventional power combiner 80 illustrated in FIG. 6B, produces a single output (e.g., output 83) by summing two different input signals (e.g., inputs 82A&B), using: 1) a pair of input transmission lines (e.g., artificial transmission lines 75B&C); 2) a single output transmission line (e.g., artificial transmission line 85C); and 3) multiple gain cells (e.g., $g_m$ cells 26F). For identical gain cells and identical reactive impedance segments, the ratio by which input signals are combined, depends on the number of stages (i.e., gain cells) associated with one of the input transmission lines relative to the other. Using similar structures, the number of output transmission lines (i.e., and gain cells) can be increased to distribute power to more than two output lines, or the number of input transmission lines (i.e., and gain cells) can be increased to combine the power from more than two input lines.

Distributed networks have been utilized to extend the operating bandwidth of conventional apparatuses that perform the functions of signal amplification, power dividing, and power combining Distributed networks, however, have not been utilized in the design of circuits that perform the noise shaping function which is conventionally provided by phase-locked loops and delta-sigma modulators. To support advances in analog and digital signal processing speeds, therefore, the need exists for a distributed noise shaping apparatus (i.e., modulator) that offers a wider bandwidth of operation than is possible through conventional means.

SUMMARY OF THE INVENTION

The present invention provides an improved modulator for noise shaping applications, which uses distributed networks to attenuate the level of unwanted noise and distortion in a particular frequency band, without attenuating the level of a desired signal in the same frequency band. Compared to conventional circuits used for noise shaping, a distributed modulator according to the preferred embodiments of the present invention, can provide effective noise shaping over very wide bandwidths and at very high frequencies. Therefore, such a distributed modulator can be particularly advantageous in applications, where due to a high frequency of operation, the intrinsic capacitance of active devices is a significant concern.

Thus, one specific embodiment of the invention is directed to an apparatus for shaping the noise and distortion introduced by the sampling and quantization of a continuous-time input signal by an external (auxiliary) sampling/quantization device, and includes: 1) an input line for receiving an input signal that is continuous in time and in value; 2) a first auxiliary line for providing a magnitude-scaled and time-delayed version of said input signal to an external (auxiliary) sampling/quantization device; 3) a second auxiliary line for receiving a quantized signal from an external sampling/quantization device; 4) a first active ladder network with a first input coupled to the input line, a second input, a first output coupled to the first auxiliary line, and a second output; and 5) a second active ladder network with a first input coupled to the second output of the first active ladder network, a second input coupled to the second auxiliary line, and an output coupled to the second input of the first active ladder network. Both active ladder networks comprise a plurality of reactive impedance segments (e.g., L-sections), each of which includes at least one shunt capacitive element, as either an active (i.e., gain cell) or passive (i.e., capacitor) device, and at least one series inductance element. In addition, each reactive impedance segment has a frequency response with a low-pass corner frequency that equals or exceeds the maximum operating frequency that is intended for the overall apparatus. In concatenation, one or more of the reactive impedance segments form controlled-impedance transmission channels over which a propagating signal is delayed in time, scaled in magnitude, and then combined with other signals to generate output signals. The first (feed-forward) active ladder network generates output signals through a controlled-impedance transmission channel that: 1) combines a signal coupled from a first input with a signal coupled from a second input; and 2) introduces to the resulting combined signal, a time delay which equals or exceeds the minimum propagation delay associated with any of the reactive impedance segments (i.e., any of the reactive impedance segments comprising the first or second active ladder networks). The second (feedback) active ladder network generates an output by combining a continuously-variable (i.e., continuous in value) signal coupled from a first input with a quantized (i.e., discrete in value) signal coupled from a second input, such that both signals propagate through one or more controlled-impedance transmission channels which: 1) comprise a unique combination of reactive impedance segments; and 2) create distinct propagation paths through which different amounts of time delaying and magnitude scaling are applied. In combination, the controlled-impedance transmission channels of the first and second active ladder networks form distinct feedback paths, through which previous output signals are coupled to input signals. The time delaying through any feedback path differs from the time delaying through any other feedback path, by an amount that equals or exceeds the minimum propagation delay associated with any of the reactive impedance segments (i.e., the smallest propagation delay for any of the L-sections within the first or second ladder networks). In addition, the operation of the apparatus is such that: 1) the number of distinct feedback paths determines the order of a noise-shaped response produced by the overall apparatus; 2) the magnitude scaling applied through the various feedback paths determines the location of a spectral minimum in the noise-shaped response; and 3) the signal response is approximately all-pass over an intended operating bandwidth, regardless of the order or spectral minimum associated with the noise-shaped response.

A distributed modulator, which incorporates any of the embodiments of the invention described above, often can effectively operate at a high frequency to shape the unwanted noise and distortion introduced to a broadband signal by an external (auxiliary) device, including noise and distortion introduced by a coarse quantizer, a nonlinear amplifier, or a noisy oscillator. Such a modulator can have utility in various commercial, industrial and military applications, e.g., in various direct conversion transmitters, software-defined or cognitive radios, multi-channel communication transmitters, all-digital RADAR systems, and high-speed arbitrary waveform generators.

The foregoing summary is intended merely to provide a brief description of certain aspects of the invention. A more complete understanding of the invention can be obtained by referring to the claims and the following detailed description of the preferred embodiments in connection with the accompanying figures.

BRIEF DESCRIPTION OF THE DRAWINGS

In the following disclosure, the invention is described with reference to the attached drawings. However, it should be understood that the drawings merely depict certain representative and/or exemplary embodiments and features of the present invention and are not intended to limit the scope of the invention in any manner. The following is a brief description of each of the attached drawings.

FIG. 6A is a block diagram of a conventional circuit which utilizes multiple artificial transmission lines and gain cells to distribute a single input signal to two different output lines; and FIG. 6B is a block diagram of a conventional circuit which utilizes multiple artificial transmission lines and gain cells to combine two different input signals into a single output signal.

FIG. 8C is a block diagram of a first alternate implementation of a distributed modulator that shapes noise and distortion according to a second-order response, and utilizes a plurality of gain cells and reactive impedance segments to form controlled-impedance transmission channels over which propagating signals are delayed in time and scaled in magnitude.

DESCRIPTION OF THE PREFERRED EMBODIMENT(S)

Conventional methods, such as parallel processing, have been developed that allow modern digital signal processors to operate at effective rates which exceed the limitations of constituent components. The present inventor has discovered that distributed networks provide a means to correspondingly extend the operating bandwidth of analog signal processors. In light of this, the present invention provides novel, distributed architectures for noise-shaped modulation at bandwidths and frequencies which are higher than those obtainable by conventional means. In a conventional $\Delta\Sigma$ modulator, noise shaping is performed using active integrators (e.g., operational amplifiers, transconductance amplifiers) that exhibit poor high-frequency performance due to a fundamental trade-off (e.g., the Miller effect) between gain and bandwidth (i.e., a fixed gain-bandwidth product prevents bandwidth from increasing without a proportional reduction in gain). Recognizing a need for extending the operating bandwidth of conventional noise-shaped modulators, particularly those based on DFL architectures, the present inventor has developed innovative distributed modulator structures by adapting some of the methods used to implement distributed amplifiers, distributed power dividers, and distributed power combiners. A distributed modulator, according to the preferred embodiments of the present invention, overcomes the bandwidth limitations of conventional modulators by: 1) combining active devices with discrete inductors to form controlled-impedance transmission channels and alleviate conventional gain-bandwidth dependencies; and 2) using the resulting controlled-impedance transmission channels to generate the feedback filter responses from which a Diplexing Feedback Loop is constructed. Such an approach can in some respects be thought of as a unique and novel adaptation of two conventional technologies—distributed amplifiers and Diplexing Feedback Loops. As discussed in more detail below, the use of such an approach often can overcome the bandwidth limitations associated with conventional methods of noise shaping.

Figure 1A:
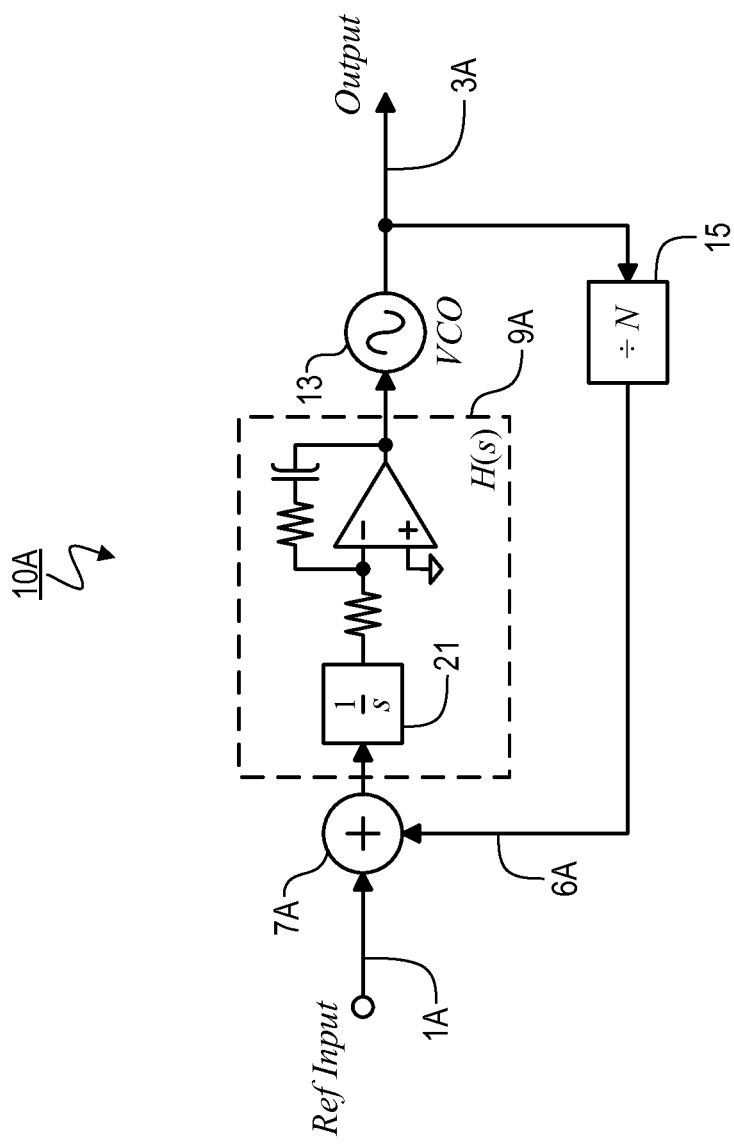
FIG. 1A is a block diagram of a conventional phase-locked loop, which shapes the phase noise at the output of a voltage-controlled oscillator according to a second-order response.
Figure 1B:
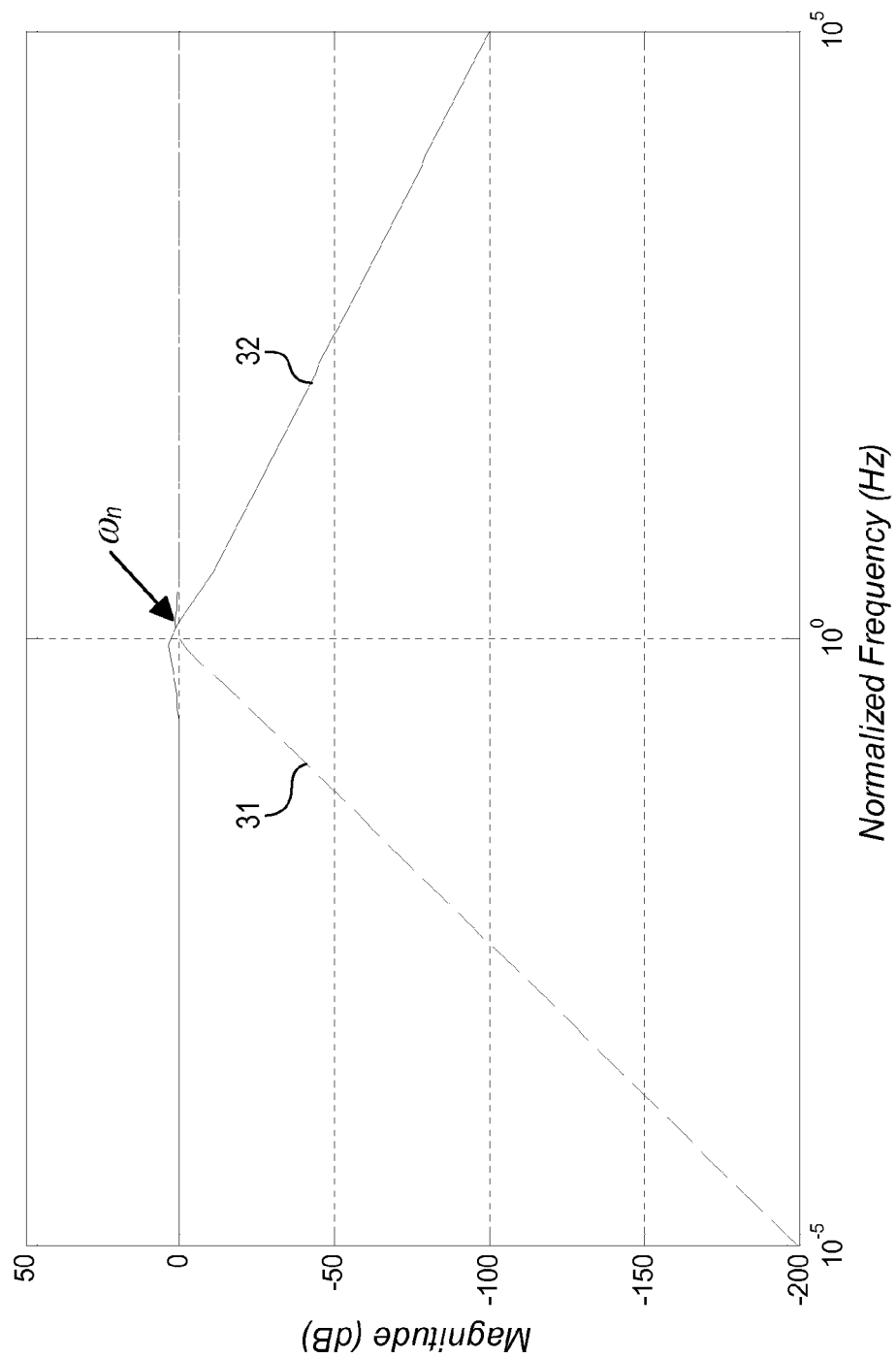
FIG. 1B is a graph showing the magnitude responses of the signal-transfer-function and the noise-transfer-function of a conventional phase-locked loop.
Figure 2A:
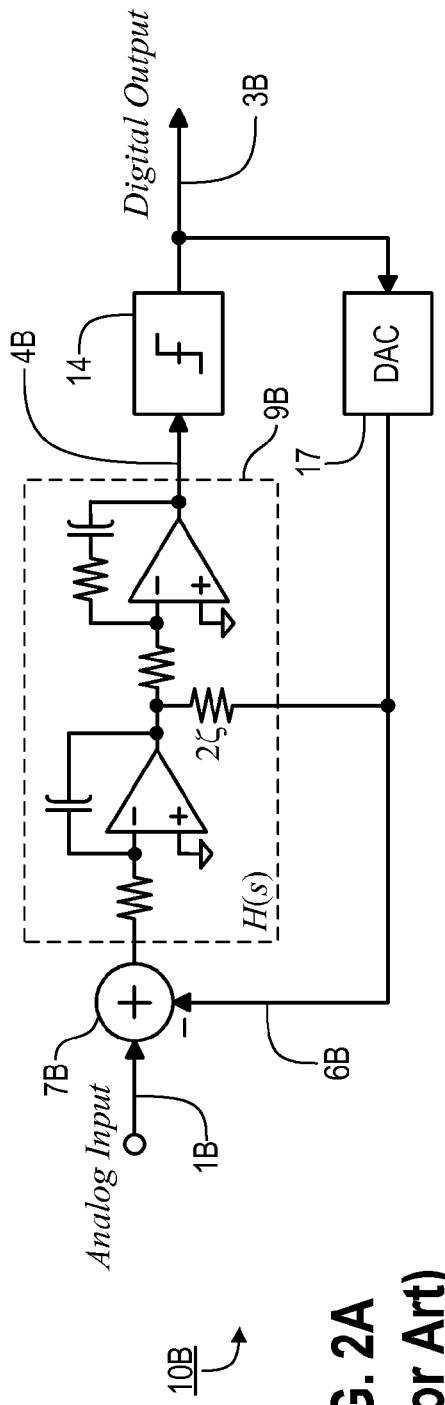
FIG. 2A is a block diagram of a conventional delta-sigma modulator, which shapes quantization noise according to a second-order response, and utilizes operational amplifiers to perform a feed-forward integration operation.
Figure 2B:
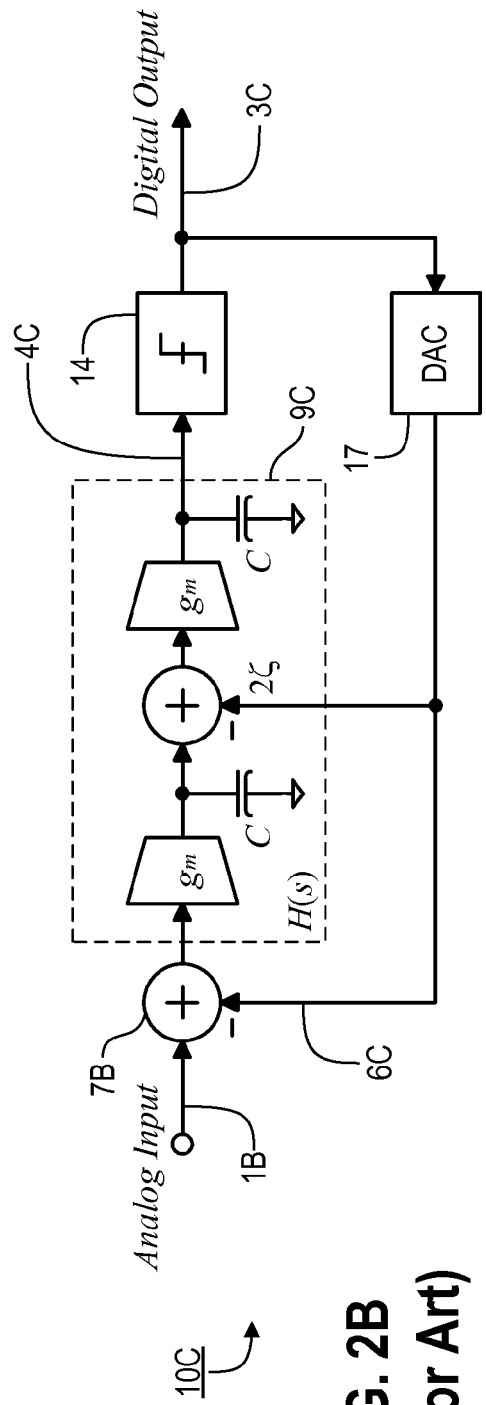
FIG. 2B is a block diagram of a conventional delta-sigma modulator, which shapes quantization noise according to a second-order response, and utilizes transconductance amplifiers to perform a feed-forward integration operation.
Figure 2C:
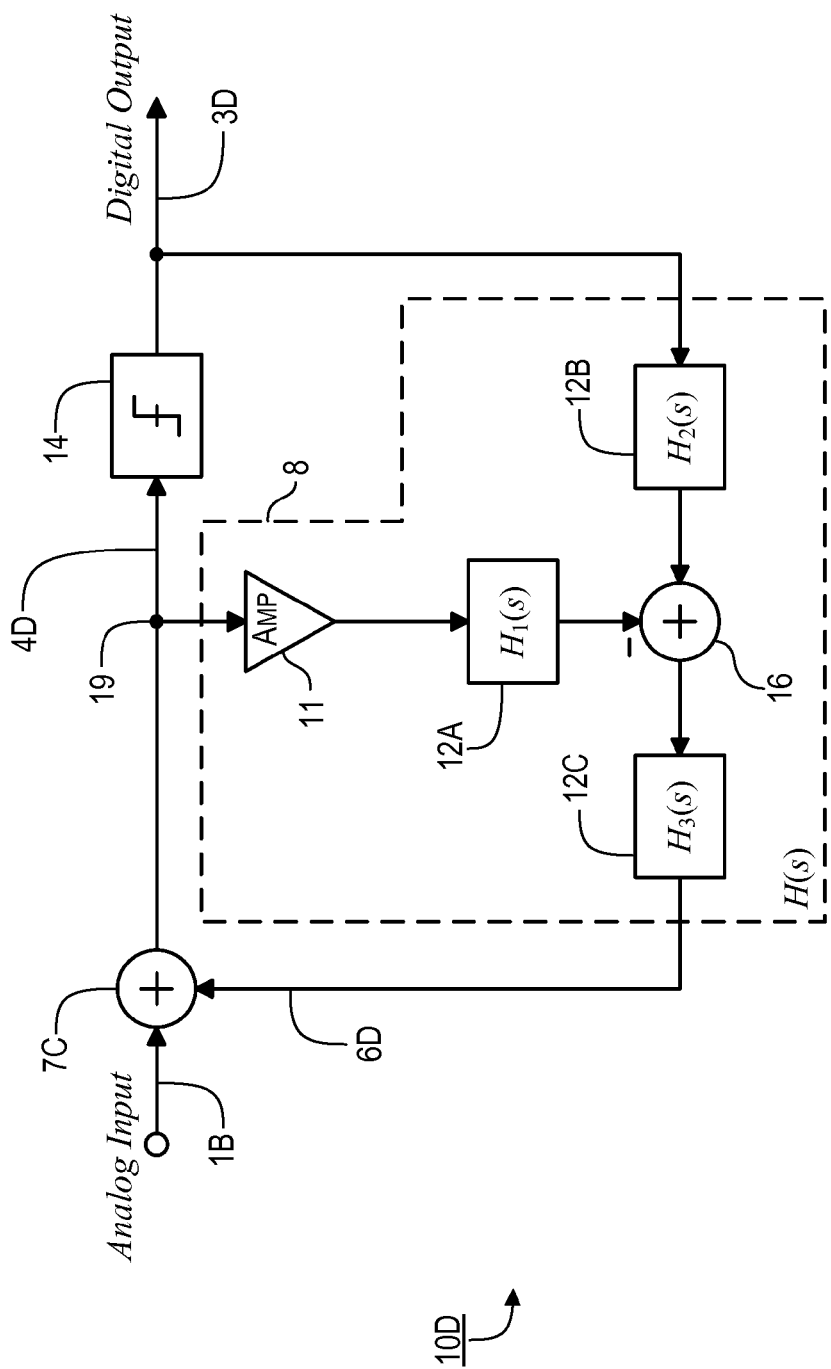
FIG. 2C is a block diagram of a Diplexing Feedback Loop, which uses feedback filters to shape quantization noise according to a second-order response.
Figure 2D:
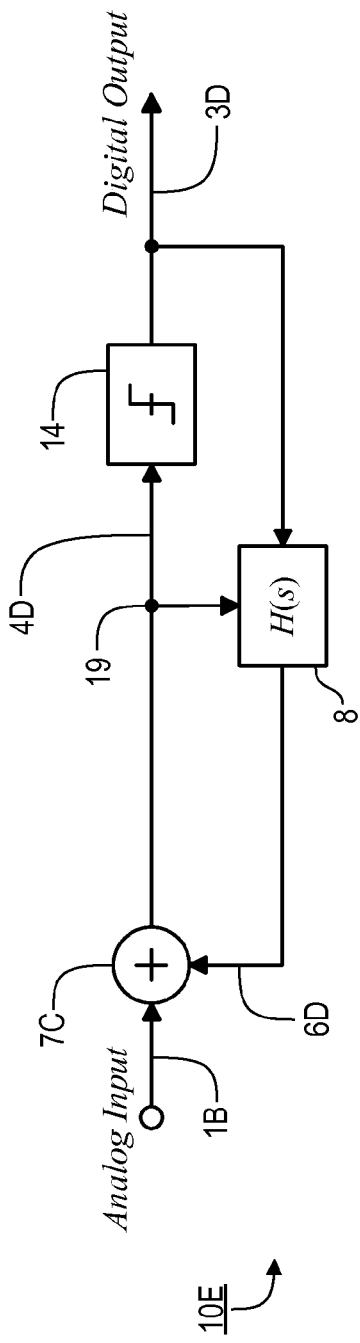
FIG. 2D is a generalized block diagram of a Diplexing Feedback Loop that shapes quantization noise according to a second-order response.
Figure 2E:
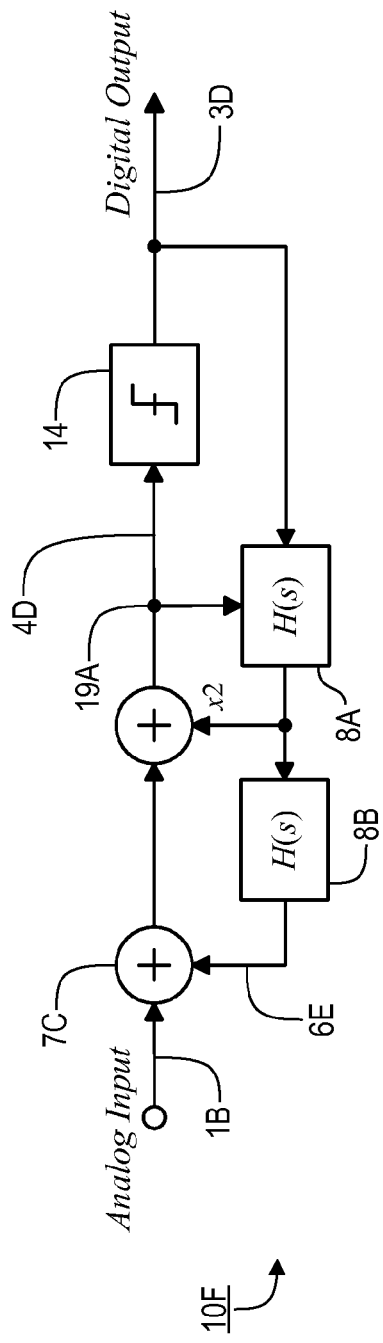
FIG. 2E is a generalized block diagram of a Diplexing Feedback Loop that shapes quantization noise according to a fourth-order response.
Figure 3A:
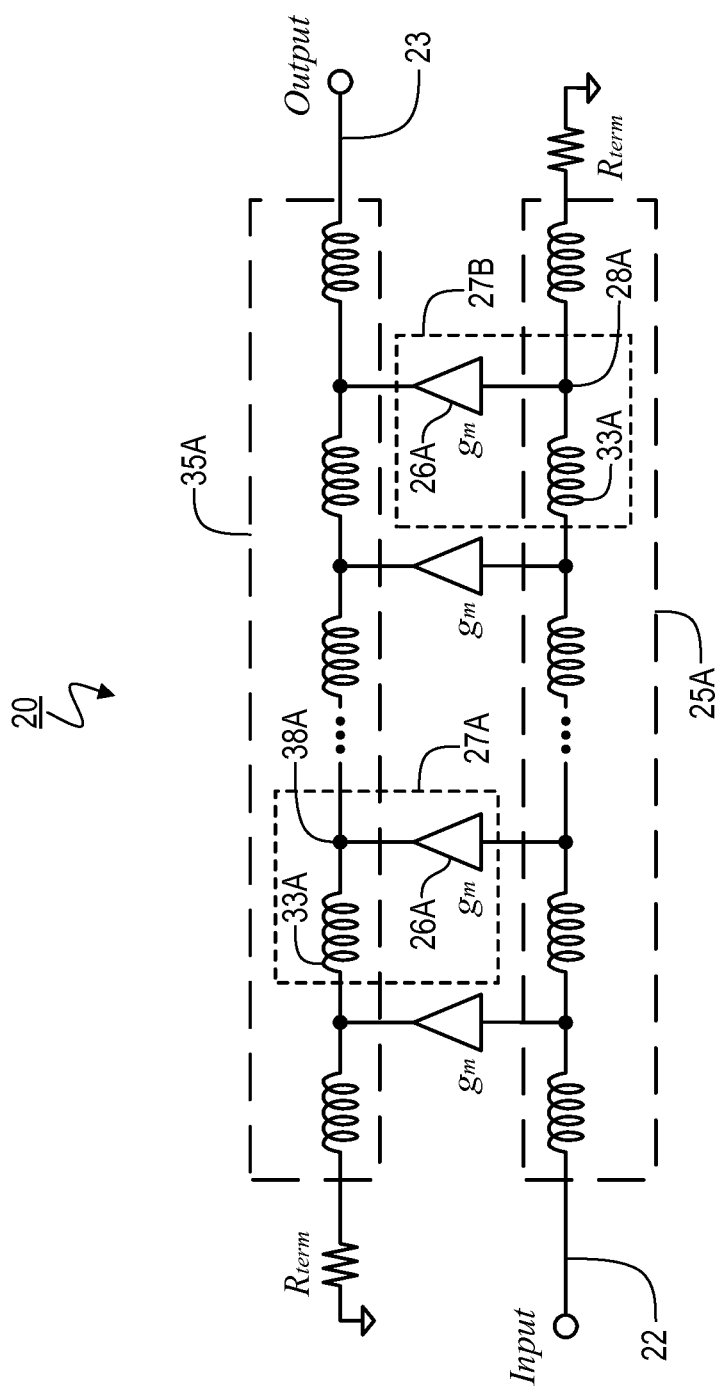
FIG. 3A is a block diagram of a conventional distributed amplifier, which comprises an input transmission line, an output transmission line, and multiple gain cells.
Figure 3B:
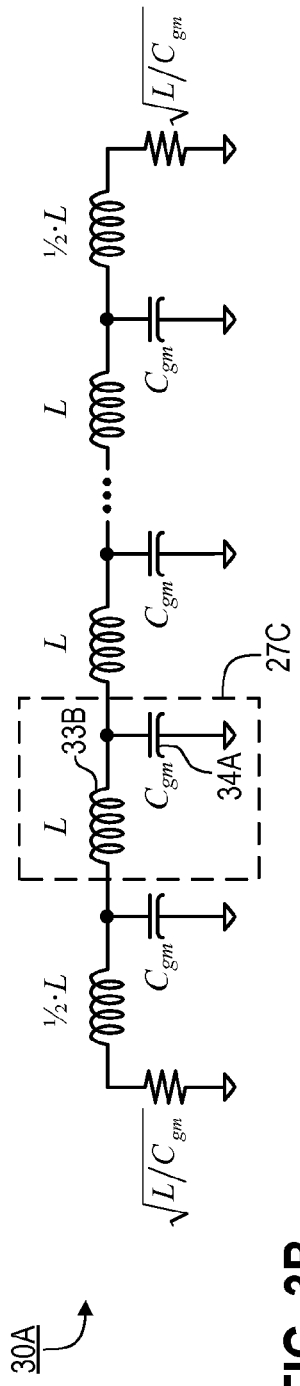
FIG. 3B is a block diagram of an artificial transmission line comprising multiple reactive impedance segments, and having a series inductor as the first reactive element.
Figure 3C:
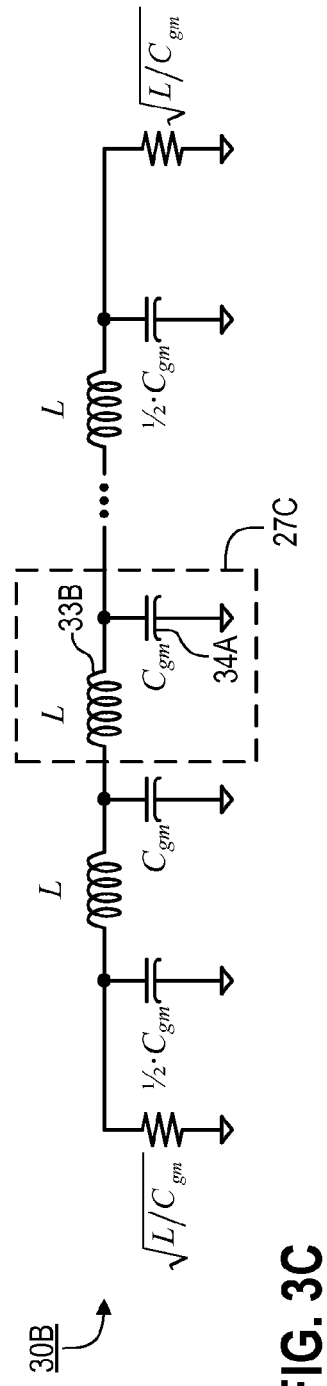
FIG. 3C is a block diagram of an artificial transmission line comprising multiple reactive impedance segments, and having a shunt capacitor as the first reactive element.
Figure 7A:
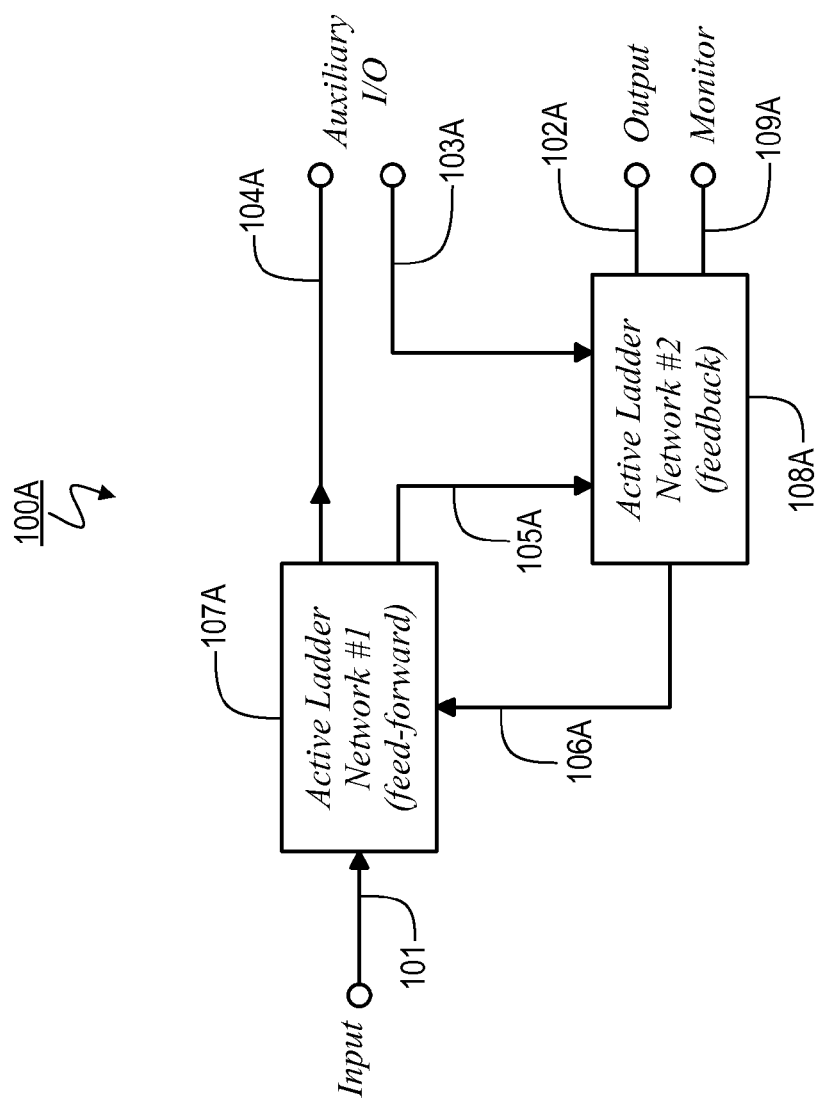
FIG. 7A is a simplified block diagram of a distributed modulator according to a representative embodiment of the invention, which shapes noise and distortion using a first active ladder network for feed-forward processing and a second active ladder network for feedback processing.

A simplified block diagram of a distributed modulator (e.g., distributed modulator 100A) according to the preferred embodiments of the invention is illustrated in FIG. 7A. In the preferred embodiments, a distributed modulator includes two active ladder networks: one network (e.g., network 107A) which performs feed-forward processing and another network (e.g., network 108A) which performs feedback processing. Referring to the Diplexing Feedback Loop (DPL) shown in FIG. 2C, active ladder network 107A of modulator 100A, is comparable in functionality to combiner 7C of DPL 10D; and active ladder network 108A of modulator 100A, is comparable in functionality to feedback filter 8 of DPL 10D. Each of the active ladder networks includes a plurality of reactive impedance segments (e.g., conventional L-sections), with a plurality of gain cells (e.g., conventional transconductance amplifiers), that form controlled-impedance transmission channels over which propagating signals are delayed in time and scaled in magnitude. Preferably, each of the reactive impedance segments has a low-pass corner frequency ($f_C$) that exceeds a maximum operating frequency ($f_B$) for the overall modulator, which preferably is tailored to the frequency characteristics of the input signal (e.g., signal 101). Feed-forward network 107A combines continuously-variable (i.e., continuous in value) input signal 101 with continuously-variable feedback signal 106A, and preferably applies minimal additional processing to produce output signals 104A and 105A. More specifically, in the preferred embodiments, this minimal additional processing includes only a delay in time τ, which is less than the inverse of the maximum operating frequency for the modulator, such that $\tau \leq 1/(2\pi \cdot f_B)$. Output signal 104A preferably is coupled to an external (auxiliary) sampling/quantization device, which returns as signal 103A, a quantized and oversampled version of signal 104A. It should be noted that in alternate embodiments, however, output signal 104A can be provided to, and input signal 103A can be received from, a different type of external device (which can introduce different kinds of noise and/or distortion). Nevertheless, for ease of discussion, the following embodiments generally assume that the external device performs sampling and quantization (introducing noise and distortion characteristic of such operations). Feedback network 108A processes quantized signal 103A (e.g., an output signal from the external quantizer) together with continuously-variable signal 105A (i.e., an output signal from feed-forward network 107A) to produce feedback signal 106A. Preferably, the processing within feedback network 108A is such that both signal 103A and signal 105A propagate through multiple controlled-impedance transmission channels, where each channel: 1) comprises a unique combination of reactive impedance segments (e.g., L-sections) and gain cells (e.g., transconductance amplifiers); and 2) establishes a distinct feedback path (i.e., in conjunction with propagation within ladder network 107) through which different amounts of time delaying and magnitude scaling are applied to propagating signals. More specifically, in the preferred embodiments, the propagation delay associated with any one of the distinct feedback paths (i.e., any one of the controlled-impedance transmission channels formed by a concatenation of reactive impedance segments within ladder networks 107A and 108A) differs from the propagation delay associated with any other of the distinct feedback paths by no less than the smallest delay (δ) produced by any of the reactive impedance segments (i.e., any of the L-sections comprising the first or second ladder networks). Consequently, the maximum difference in the propagation delays associated with any two distinct feedback paths equals or exceeds N·δ, where N is the total number of distinct feedback paths associated with modulator 100A. Additionally, as signals propagate through the various feedback paths, they are preferably combined into a single output (e.g., output signal 106A).

As used herein, the term "coupled", or any other form of the word, is intended to mean either directly connected or connected through one or more other elements, such as reactive impedance segments, gain cells, or other processing blocks. It should be noted that exemplary modulator 100A also provides: 1) a quantized output signal (e.g., signal 102A), which is a time-delayed and magnitude-scaled version of quantized signal 103A; and 2) a monitor signal (e.g., signal 109A) which emulates the noise and distortion introduced by the sampling/quantization operation of the external (auxiliary) device. In alternate embodiments, however, signal 102A is absent, and a quantized signal is extracted directly from the external (auxiliary) device. In still other alternative embodiments, the monitor signal is absent.

Figure 8A:
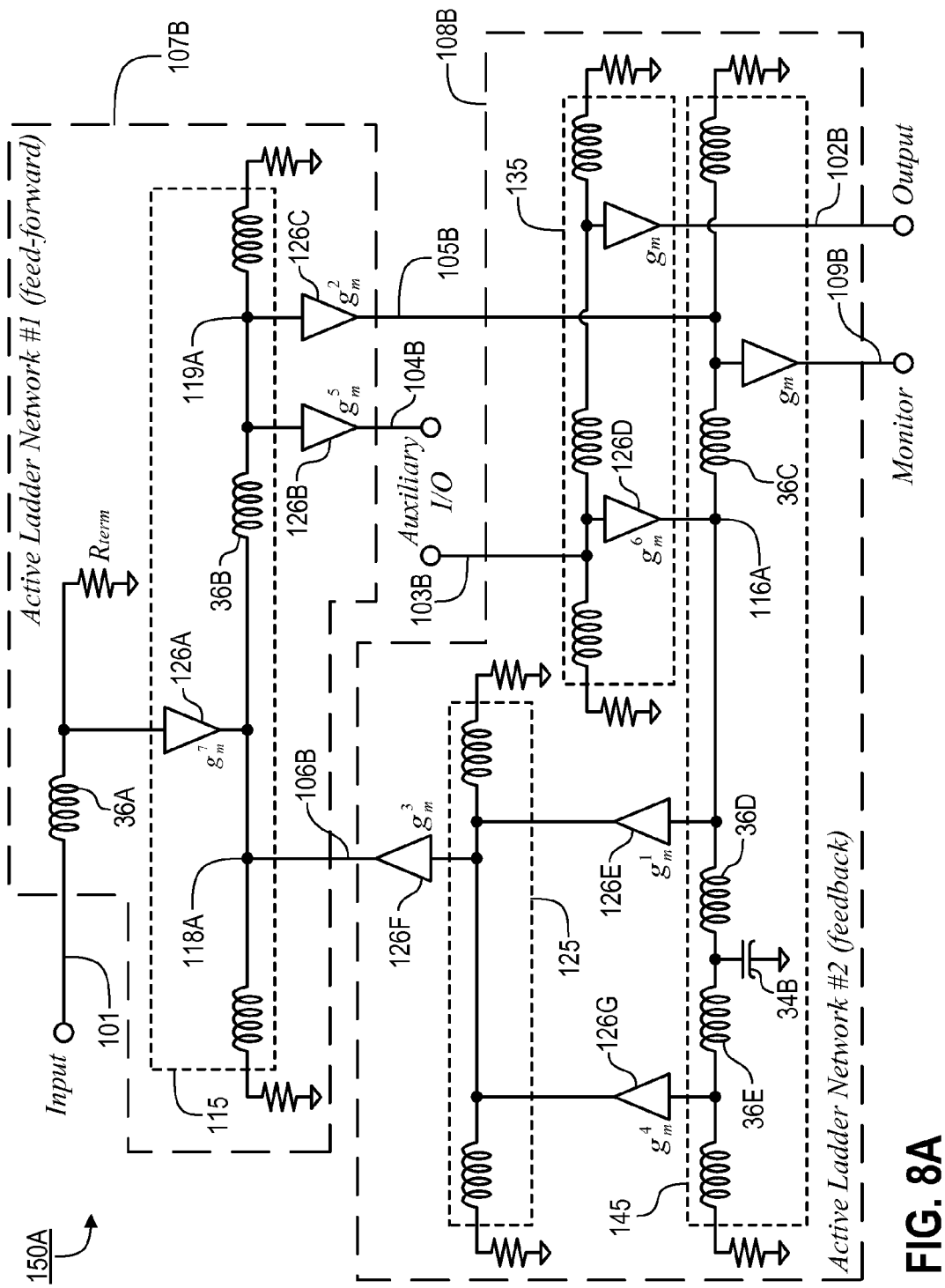
FIG. 8A is a block diagram of an exemplary implementation of a distributed modulator that shapes noise and distortion according to a second-order response, and utilizes a plurality of gain cells and reactive impedance segments to form controlled-impedance transmission channels over which propagating signals are delayed in time and scaled in magnitude.

FIG. 8A provides a more detailed block diagram of a distributed modulator according to the preferred embodiments of the invention, which uses reactive impedance segments and gain cells to shape noise with a second-order response. Distributed modulator 150A, shown in FIG. 8A, includes: 1) an input line for receiving input signal 101; 2) an output line for providing output signal 102B; 3) a monitor line for providing error signal 109B; and 4) two auxiliary lines for receiving quantized signal 103A and providing continuously-variable signal 104B. As illustrated in FIG. 8A, circuit 150A incorporates a plurality of reactive impedance segments and gain cells (e.g., transconductance cells 126A-G), which are grouped into four artificial transmission lines (e.g., transmissions lines 115, 125, 135, and 145). Artificial transmission line 115 contains two reactive impedance segments (i.e., two complete L-sections with two associated junction points), artificial transmission line 125 contains a single reactive impedance segment (i.e., one complete L-section with one associated junction point), artificial transmission line 135 contains two reactive impedance segments (i.e., two complete L-sections with two associated junction points), and artificial transmission line 145 contains four reactive impedance segments (i.e., four complete L-sections with four associated junction points). The signal processing performed by exemplary circuit 150A is such that, within a first active ladder network (e.g., feed-forward network 107B), input signal 101 is coupled to central node 118A (i.e., through inductor 36A and gain cell 126A), where it is combined with feedback signal 106B. The combined signal is then scaled in magnitude and delayed in time, as it propagates through the L-section formed by inductor 36B and the intrinsic (input) capacitances of gain cells 126B&C, in order to create at node 119A, a signal which becomes auxiliary output 104B and signal 105B. Signal 104B preferably is provided to an external (auxiliary) device that returns, as signal 103B, a quantized and oversampled version of signal 104B. Due to quantization and sampling, signal 103B could have, for example, higher levels of distortion and noise compared to continuously-variable signals 104B and 105B. Subsequently, quantized signal 103B and continuously-variable signal 105B are provided as inputs to a second active ladder network (e.g., feedback network 108B), where at node 116A, the quantized signal 103B (i.e., after passing through gain cell 126D) merges with a version of signal 105B that has been subjected to the propagation delay of the L-section formed by discrete inductor 36C, the intrinsic (output) capacitance of gain cell 126D, and the intrinsic (input) capacitance of gain cell 126E. In the exemplary embodiment of modulator 150A, the merged signal at junction point 116A is then distributed between two controlled-impedance transmission channels: 1) a first transmission channel that establishes a first feedback path, and over which the merged signal is coupled to central junction point 118A through gain cells 126E&F; and 2) a second transmission channel that establishes a second feedback path, and over which the merged signal is coupled to central junction point 118A through gain cells 126G&F (i.e., after also passing through a reactive impedance segment associated with artificial transmission line 145). From node 116A, signals propagating through the first transmission channel (i.e., signals traversing the first feedback path) are subjected to no additional delay (e.g., the signals propagate through no additional L-sections). Signals propagating through the second transmission channel (i.e., signals traversing the second feedback path), however, are subjected to two additional delays: 1) the additional delay of the L-section formed by discrete inductor 36D and discrete capacitor 34B; and 2) the additional delay of the L-section formed by discrete inductor 36E and the intrinsic (input) capacitance of gain cell 126G. Finally, the signal propagating through the first transmission channel (i.e., the signal completing propagation through the first feedback path) and the signal propagating through the second transmission channel (i.e., the signal completing propagation through the second feedback path) are combined, at central junction point 118A, with a version of input signal 101 that has propagated through inductor 36A and gain cell 126A.

Figure 7B:
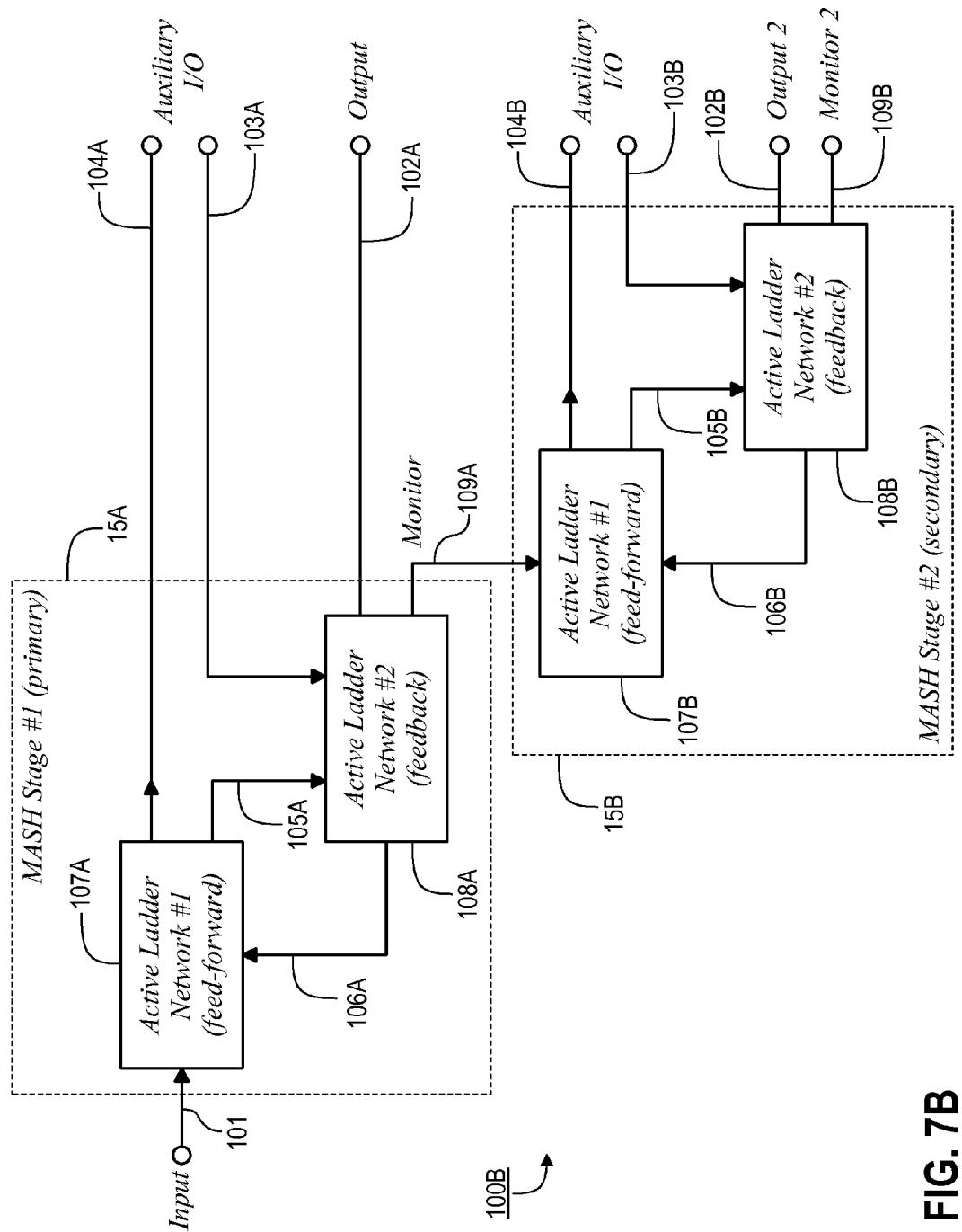
FIG. 7B is a simplified block diagram of two distributed modulators, according to a representative embodiment of the invention, which are configured according to a conventional scheme for multi-stage (noise) shaping (MASH).

Referring to exemplary modulator 150A, the additional delay of the second transmission channel (i.e., the transmission channel within ladder network 108B where signals pass through gain cell 126G) means that, compared to any signals traversing the first feedback path, any signals traversing the second feedback path are delayed by an amount which is larger by twice the propagation delay of a reactive impedance segment (i.e., assuming the propagation delay of the L-section formed by discrete inductor 36D and discrete capacitor 34B is equal to the propagation delay of the L-section formed by discrete inductor 36E and the intrinsic capacitance of gain cell 126G). In general, the time delay resulting from traversing any one distinct feedback path, preferably differs from the time delay resulting from traversing any other distinct feedback path, by an amount which equals or exceeds the minimum propagation delay associated with any of the reactive impedance segments (i.e., the smallest propagation delay of any of the L-sections comprising the first or second active ladder networks). Herein, a feedback path is referred to as being "distinct" if the time delay produced by that feedback path is different from the time delay produced by any other feedback path, by an amount which equals or exceeds the minimum propagation delay associated with any of the reactive impedance segments. Also, it should be noted that when the L-section formed by discrete inductor 36A and the intrinsic (input) capacitance of gain cell 126A has a sufficiently high cutoff frequency (e.g., a cutoff frequency that exceeds the maximum frequency occupied by input signal 101), the time delaying and the magnitude scaling introduced to input signal 101, as it is coupled to central junction point 118A, is inconsequential with respect to the modulator operation. In the preferred embodiments, a quantized signal (e.g., signal 103B) and a continuously-variable signal (e.g., signal 105B) are merged (e.g., at junction point 116A) with opposite phases, such that: 1) the merged signal is the difference between the quantized signal and the continuously-variable signal; and 2) the merged signal emulates the noise and distortion introduced by the quantization operation of the external (auxiliary) device. In the exemplary embodiment of modulator 150A, a version of the merged signal (i.e., an error signal) is coupled to a monitor line as output 109B, which for example, could be used as: 1) a reference for a calibration process; and/or 2) an input to a second modulator stage according to a conventional multi-stage (noise) shaping (MASH) configuration (e.g., see modulator 100B of FIG. 7B). In alternate embodiments, however, the monitor line is absent.

Again referring to exemplary modulator 150A of FIG. 8A, a quantized version of the input signal (e.g., signal 103B) and a continuously-variable version of the input signal (e.g., signal 105B) preferably are merged into a composite (i.e., error) signal, before being coupled to a central junction point (e.g., central node 118A) through a first transmission channel and a different second transmission channel. In alternate embodiments, however, a quantized version of the input signal and a continuously-variable version of the input signal retain their separate identities, and are coupled to a central junction point through separate transmission channels (e.g., the quantized version of the input signal is fed back through two channels which are physically different from the two channels through which the continuously-variable version of the input signal is fed back). Herein, transmission channels are referred to as being "physically different" if the combination of reactive impedance segments forming one transmission channel is not the same combination of reactive impedance segments forming the other transmission channel. Preferably, the first feedback path and the second feedback path comprise different gain cells and different reactive impedance segments, such that with respect to magnitude scaling (i.e., magnitude response) and/or time delaying (i.e., group delay response), the filtering applied to the signal traversing the first feedback path is different from the filtering applied to the signal traversing second feedback path. In the preferred embodiments, each of the reactive impedance segments that comprise any of the active ladder networks, has a low-pass corner (i.e., cutoff) frequency ($f_C$) which exceeds the maximum operating frequency ($f_B$) of the overall modulator, such that:

$$f_B < f_C \approx \frac{1}{\pi\sqrt{L_k \cdot C_k}},$$

where respectively, $L_k$ and $C_k$ are the total series inductance and shunt capacitance (i.e., discrete or intrinsic capacitance) associated with the $k^{th}$ reactive impedance segment. Assuming that $L_k=L$ and $C_k=C$ for each of the reactive impedance segments (i.e., each of the reactive impedance segments have an equivalent transfer function), then the propagation delay ($t_{PD}$) through any of the reactive impedance segments is given by:

$$t_{PD}=\sqrt{L \cdot C}.$$

In the preferred embodiments, the maximum operating frequency of the overall modulator is greater than the maximum frequency occupied by the input signal, such that the reactive impedance segments do not appreciably reduce the bandwidth of the input signal. In alternate embodiments, however, the reactive impedance segments can provide moderate bandlimiting of the input signal (e.g., for the purpose of anti-aliasing), and/or the propagation delay through a reactive impedance segment can differ from the propagation delay through another reactive impedance segment (e.g., can differ from a reactive impedance segment within the same artificial transmission line or within a different artificial transmission line).

For the case where each reactive impedance segment produces negligible bandlimiting and equal delay (i.e., the preferable conditions), the overall filtering $H_1(s) \cdot H_3(s)$ applied to the continuously-variable version of the input signal (i.e., as part of a merged signal traversing the first and second feedback paths) is approximately given by:

$$\begin{aligned}H_1(s) \cdot H_3(s) &= H_{FBK1}(s) + H_{FBK2}(s) \\ &\approx \frac{1}{2} \cdot R_{term} \cdot g_m^1 \cdot \left(\prod_{k \in \{2,3\}} g_m^k\right) \cdot \exp(-2 \cdot t_{PD} \cdot s) + \\ &\quad \frac{1}{2} \cdot R_{term} \cdot \left(\prod_{k \in \{2,3,4\}} g_m^k\right) \cdot \exp(-4 \cdot t_{PD} \cdot s) \\ &= \varphi_{00} \cdot W_{00}(s) + \varphi_{01} \cdot W_{01}(s),\end{aligned}$$

and the overall filtering $H_2(s) \cdot H_3(s)$ applied to the quantized version of the input signal (i.e., as part of a merged signal traversing the first and second feedback paths) is approximately given by:

$$H_2(s) \cdot H_3(s) = H'_{FBK1}(s) + H'_{FBK2}(s)$$

$$\approx \frac{1}{2} \cdot R_{term} \cdot g_m^1 \cdot \left( \prod_{k \in \{3,5,6\}} g_m^k \right) \cdot \exp(-t_{PD} \cdot s) +$$

$$\frac{1}{2} \cdot R_{term} \cdot \left( \prod_{k \in \{3,4,5,6\}} g_m^k \right) \cdot \exp(-3 \cdot t_{PD} \cdot s)$$

$$= \varphi_{10} \cdot W_{10}(s) + \varphi_{11} \cdot W_{11}(s),$$

where: 1) the $\phi_{ij}$ parameters are (scalar) gain terms; 2) the $W_{ij}(s)$ parameters are filter responses (e.g., an exemplary all-pass response in the above equations because of negligible bandlimiting); 3) the first term (i.e., $H_{FBK1}$ or $H'_{FBK1}$) in the above equations is the aggregate filtering applied to signals traversing the first feedback path (i.e., a combination of filtering by reactive impedance segments within the first and second active ladder networks); and 4) the second term (i.e., $H_{FBK2}$ or $H'_{FBK2}$) in the above equations is the aggregate filtering applied to signals traversing the second feedback path (i.e., a combined filtering by reactive impedance segments within the first and second active ladder networks). For appropriate choices of $g_m^k$ and $t_{PD} = \sqrt{L \cdot C}$, therefore, exemplary modulator 150A can be utilized to produce the feedback filter responses which form the basis of a second-order Diplexing Feedback Loop (DPL). Configured for operation as a DPL, exemplary modulator 150A has a signal-transfer-function (STF) that is approximately all-pass, and has a noise-transfer function (NTF) that is given by:

$$NTF(s) = \frac{1 + H_1(s) \cdot H_3(s)}{1 + H_1(s) \cdot H_3(s) - H_2(s) \cdot H_3(s)}.$$

Figures 4A, 4B, 4C, 4D:
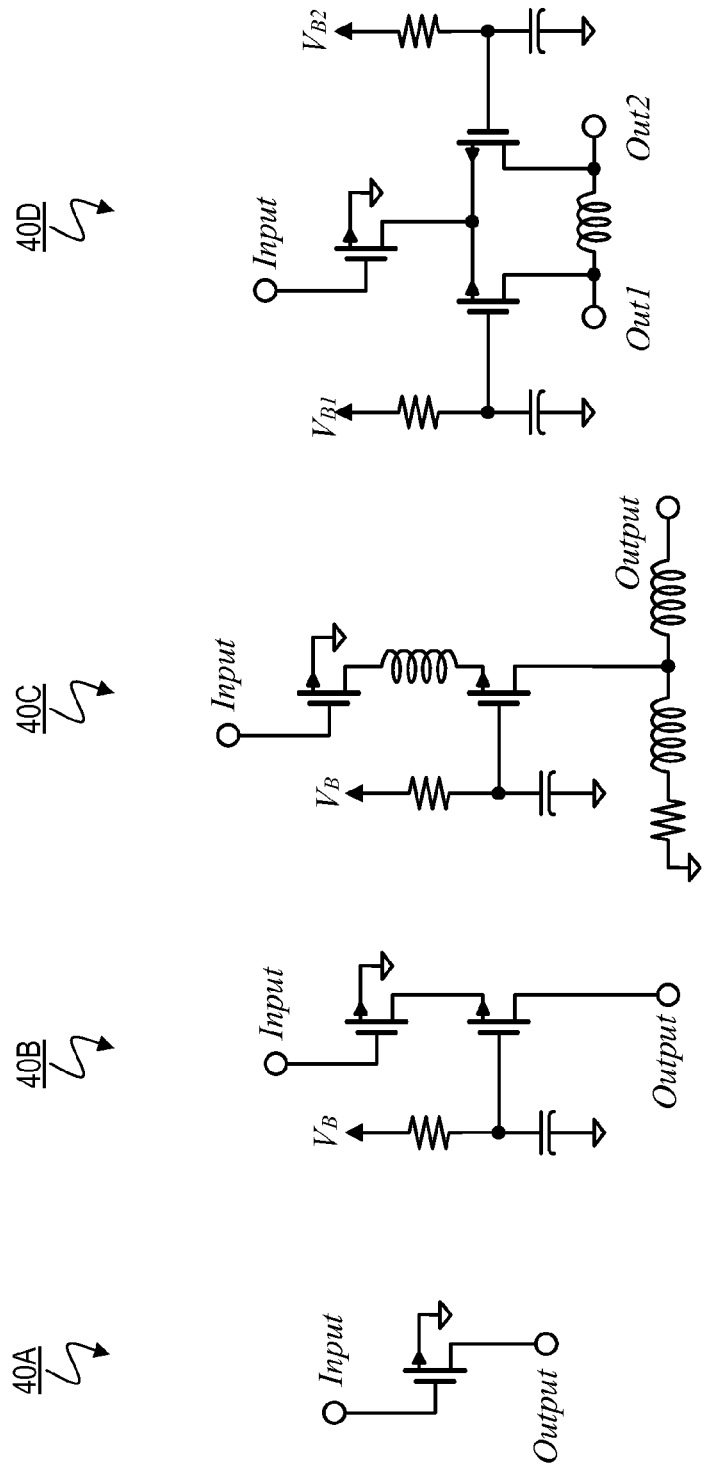
FIG. 4A is a block diagram of a conventional gain cell comprising an active device in a common-source configuration.
FIG. 4B is a block diagram of a conventional gain cell comprising two active devices in a cascode configuration, with gain control provided by a variable gate bias voltage.
FIG. 4C is a block diagram of a gain cell comprising two active devices and reactive elements in a broadband cascode configuration, with gain control provided by a variable gate bias voltage.
FIG. 4D is a block diagram of a gain cell comprising three active devices and reactive elements, in a configuration which provides both gain control and delay control through independent gate bias voltages.
Figure 5A:
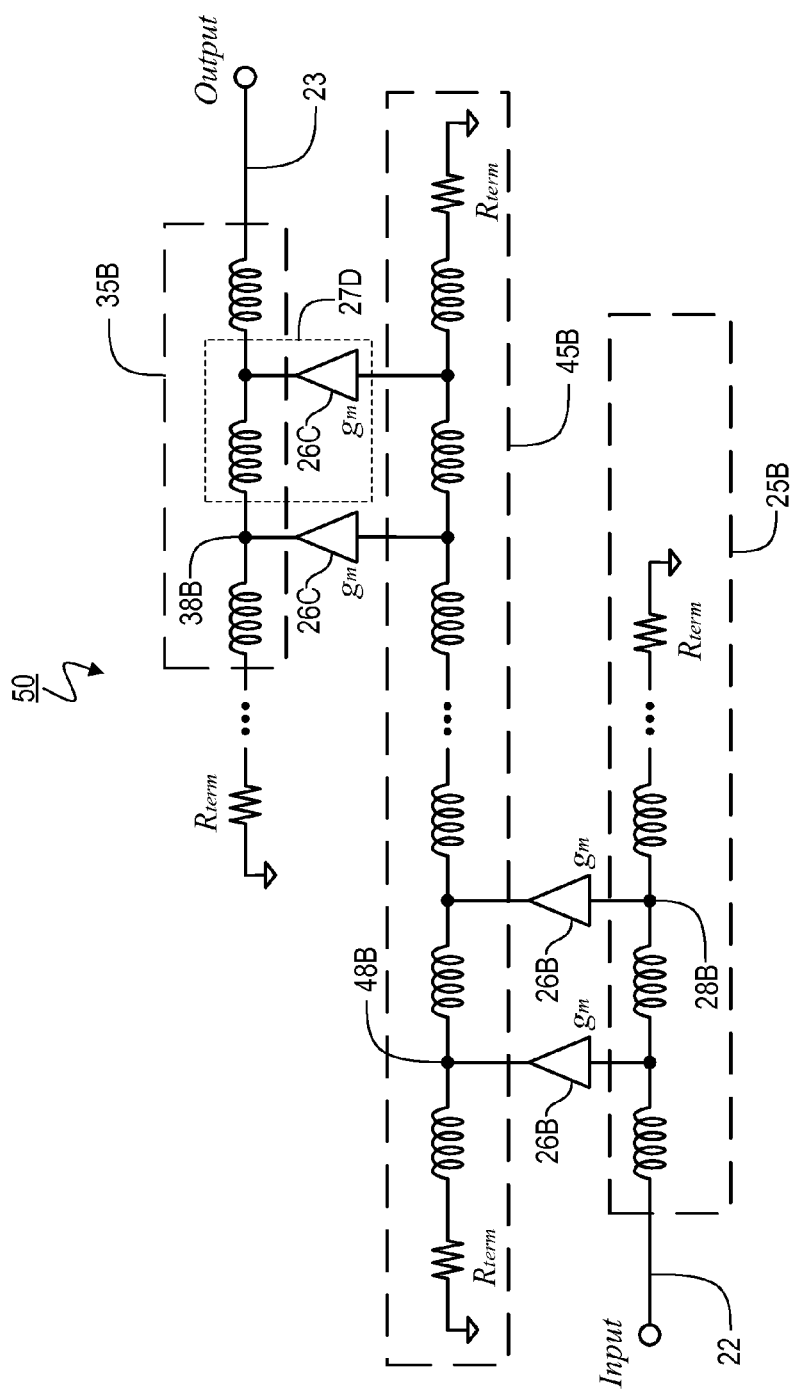
FIG. 5A is a block diagram of a conventional cascaded distributed amplifier, in which multiple gain cells are coupled through an input transmission line, an output transmission line, and an intermediate transmission line.
Figure 5B:
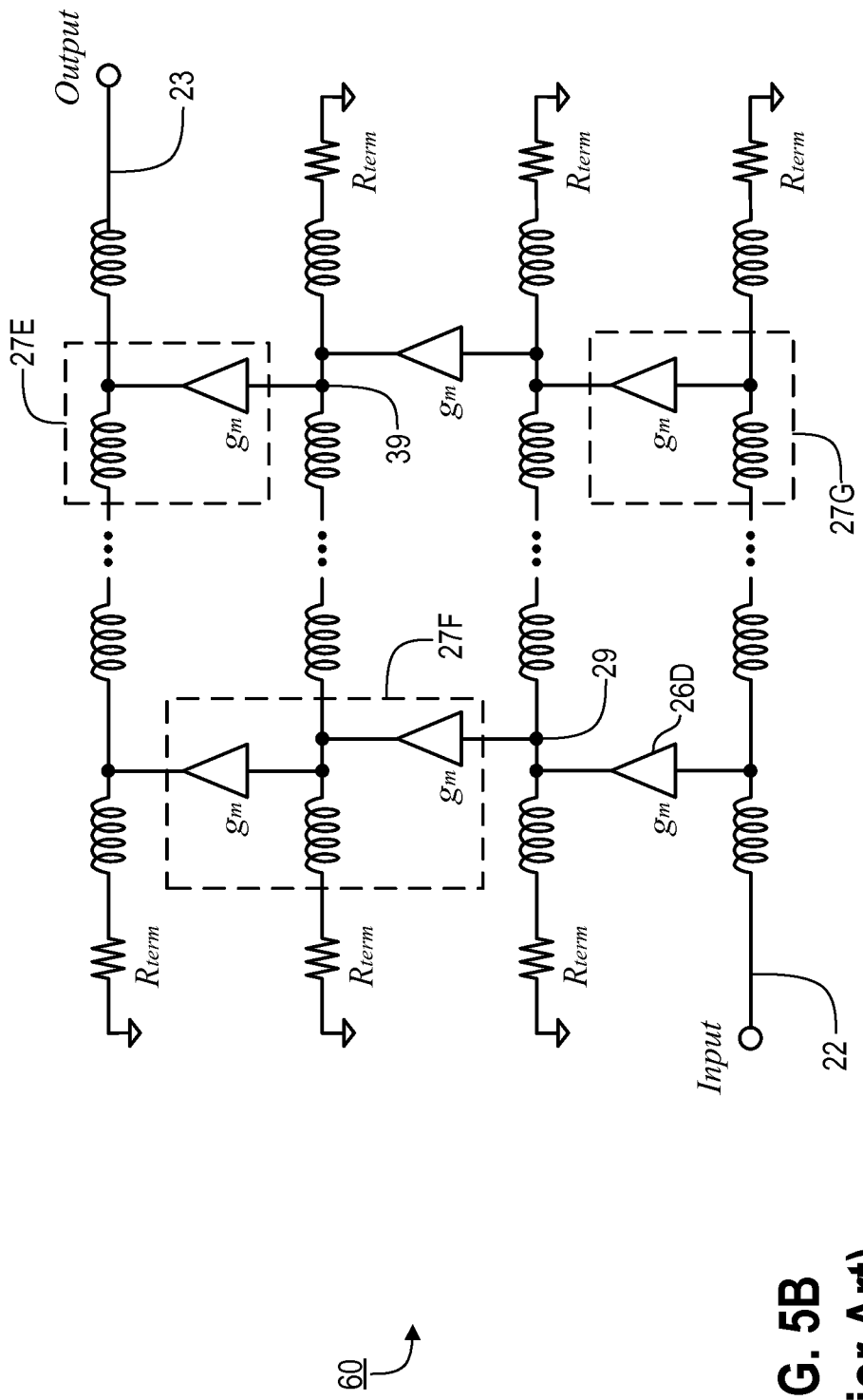
FIG. 5B is a block diagram of a conventional matrix distributed amplifier, in which multiple artificial transmission lines are utilized to couple multiple gain cells in both distributed and cascaded arrangements.
Figure 8B:
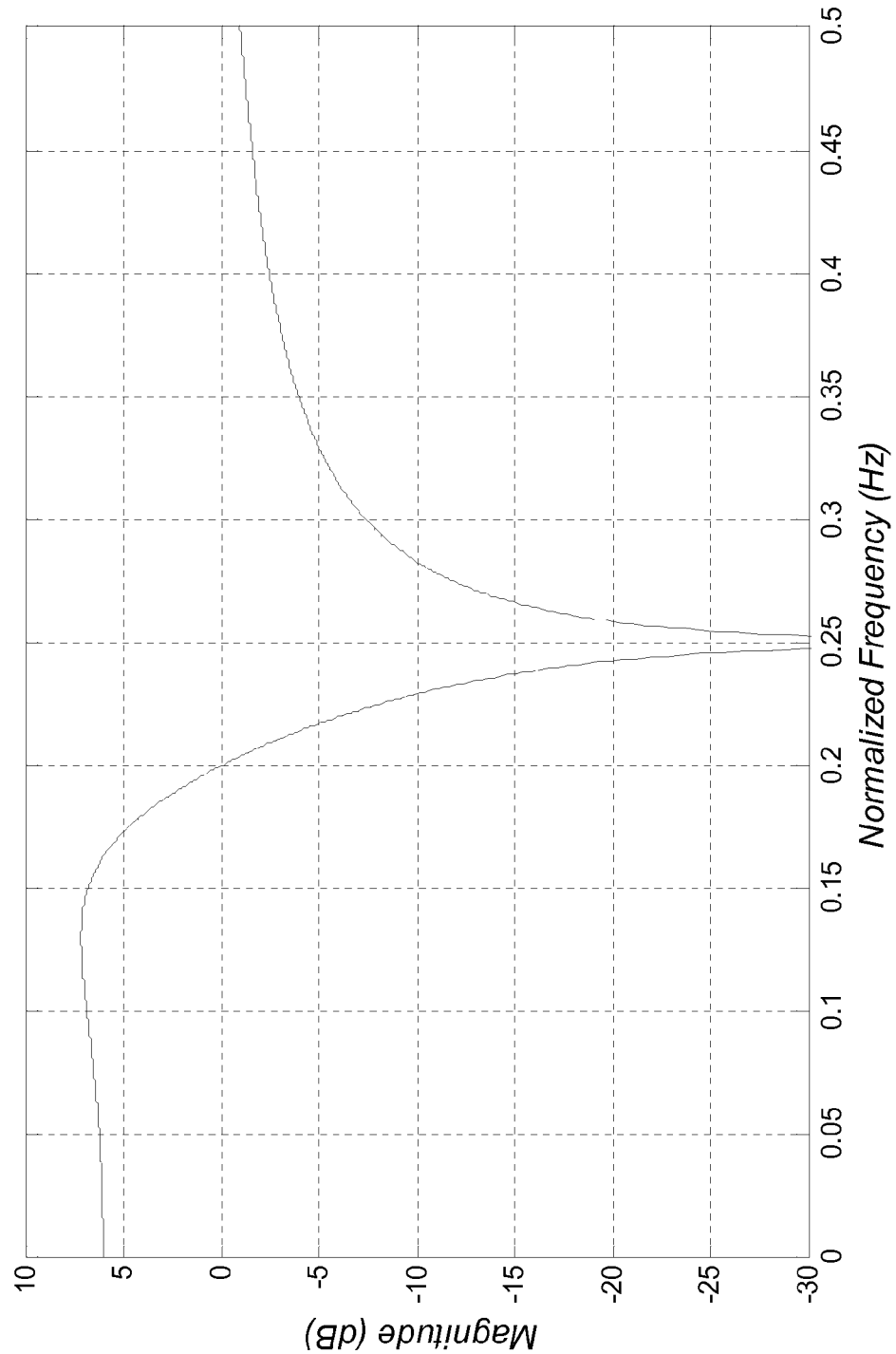
FIG. 8B is a graph showing the magnitude response of an exemplary noise-transfer-function for a second-order DPL, which utilizes a distributed modulator according to the preferred embodiments of the invention.

In the preferred embodiments, at least some of the transconductance cells $g_m^k$ are variable-gain devices (e.g., based on the conventional implementations of FIG. 4B-D), so that in a DPL configuration, the spectral null in frequency response of the NTF can be placed at arbitrary frequencies, using a control voltage (e.g., a gate bias voltage) to adjust DPL parameters $\phi_{ij}$. FIG. 8B is a diagram showing the NTF response of a second-order DPL with all-pass filter responses $W_{ij}(s)$, which has been configured through loop parameters $\phi_{ij}$ (i.e., $\phi_{00} = \phi_{10} = 0$ and $\phi_{01} = \phi_{11} = 1$) to produce a spectral null at a normalized frequency (i.e., $t_{PD} = 0.5$) of 0.25 Hertz.

An alternative exemplary modulator, according to the preferred embodiments of the present invention, is distributed modulator 150B shown in FIG. 8C. The functionality of exemplary modulator 150B is comparable to that of exemplary modulator 150A, except that: 1) all the reactive impedance segments are grouped to form artificial transmission lines having two L-sections with two associated junction points; and 2) the total shunt capacitance for each of the L-sections is equal (i.e., each L-section contains two capacitive elements produced either by gain cells, discrete capacitors 34G&H, or a combination of gain cells and discrete capacitors 34D-F). Compared to exemplary modulator 150A, exemplary modulator 150B incorporates more reactive impedance segments (i.e., the total number of L-sections is 10 for modulator 150A and is 13 for modulator 150B), which are grouped into more artificial transmission lines (i.e., the total number of artificial transmission lines is 4 for modulator 150A and is 6 for modulator 150B), but use of uniform artificial transmission lines and equal capacitive loads can result in design and implementation efficiencies. Like exemplary modulator 150A, processing in exemplary embodiment 150B is such that a magnitude-scaled and time-delayed version of input signal 101, is combined at central junction point 118B, with a merged (i.e., error) signal that traverses a first feedback path (i.e., via a first transmission channel comprising gain cells 136F-H of ladder network 108B) and a merged signal that traverses a second feedback path (i.e., via a second transmission channel comprising gain cells 136F, 137A&B, and 136H of ladder network 108B). Signals that propagate through the first transmission channel, from node 116B, are subjected to no additional delay (i.e., the signals propagate through no additional L-sections). Signals that propagate through the second transmission channel from node 116B, however, are subjected to two additional delays: 1) the additional delay of the L-section formed by discrete inductor 37D, discrete capacitor 34F, and the intrinsic (input) capacitance of gain cell 137A; and 2) the additional delay of the L-section formed by discrete inductor 37E, the intrinsic (input) capacitance of gain cell 136H, and the intrinsic (output) capacitance of gain cell 136G. Assuming L-sections have equal propagation delay, the difference between the time delay to any signals traversing the second feedback and the time delay to any signals traversing the first feedback path, is twice the propagation delay of a reactive impedance segment. As in exemplary modulator 150A, the signal that is fed back to central junction point 118B of modulator 150B, is a signal (i.e., an error signal) created by merging with opposite phases, a quantized version of the input signal (i.e., via coupling of signal 103C through gain cells 136D&E) and a continuously-variable version of the input signal (i.e., a version of signal 101 produced by magnitude scaling and time delaying through a transmission channel which includes gain cells 136B and inductor 37C). In the preferred embodiments of exemplary modulator 150B, the propagation delay ($t_{PD}$) through each reactive impedance segment of any artificial transmission line is equal, and the cut-off frequency ($f_C$) of each reactive impedance segment is greater than the maximum frequency occupied by the input signal ($\sim f_B$). Therefore, the overall filtering $H_1(s) \cdot H_3(s)$ applied to the continuously-variable version of the input signal (i.e., as a part of a merged signal traversing the first and second feedback paths) is approximately given by:

$$H_1(s) \cdot H_3(s) = H_{FBK1}(s) + H_{FBK2}(s)$$

$$\approx \frac{1}{2} \cdot R_{term} \cdot g_m^1 \cdot \left( \prod_{k \in \{2,3,4\}} g_m^k \right) \cdot \exp(-2 \cdot t_{PD} \cdot s) +$$

$$\frac{1}{2} \cdot R_{term} \cdot \left( \prod_{k \in \{2,3,4,8,9\}} g_m^k \right) \cdot \exp(-4 \cdot t_{PD} \cdot s)$$

$$= \varphi_{00} \cdot W_{00}(s) + \varphi_{01} \cdot W_{01}(s),$$

and the overall filtering $H_2(s) \cdot H_3(s)$ applied to the quantized version of the input signal (i.e., as part of a merged signal traversing the first and second feedback paths) is approximately given by:

$$H_2(s) \cdot H_3(s) = H'_{FBK1}(s) + H'_{FBK2}(s)$$

$$\approx \frac{1}{2} \cdot R_{term} \cdot g_m^1 \cdot \left( \prod_{k \in \{3,\ldots,7\}} g_m^k \right) \cdot \exp(-t_{PD} \cdot s) +$$

$$\frac{1}{2} \cdot R_{term} \cdot \left( \prod_{k \in \{3,\ldots,9\}} g_m^k \right) \cdot \exp(-3 \cdot t_{PD} \cdot s)$$

$$= \varphi_{10} \cdot W_{10}(s) + \varphi_{11} \cdot W_{11}(s),$$

whereas before (i.e., whereas for modulator 150A): 1) the $\omega_{ij}$ parameters are (scalar) gain terms; 2) the $W_{ij}(s)$ parameters are filter responses (e.g., an exemplary all-pass response in the above equations because of negligible bandlimiting); 3) the first term (i.e., $H_{FBK1}$ or $H'_{FBK1}$) in the above equations is the aggregate filtering applied to signals traversing the first feedback path (i.e., a combination of filtering by reactive impedance segments within the first and second active ladder networks); and 4) the second term (i.e., $H_{FBK2}$ or $H'_{FBK2}$) in the above equations is the aggregate filtering applied to signals traversing the second feedback path (i.e., a combination of filtering by reactive impedance segments within the first and second active ladder networks). As illustrated by exemplary embodiment 150B, equivalent noise shaping functionality can be obtained using distributed modulators (e.g., modulators 150A&B), which create and feedback quantized and continuously-variable versions of an input signal, using various arrangements and groupings of reactive impedance segments (i.e., to form various artificial transmission lines and controlled-impedance transmission channels).

Figure 8D:
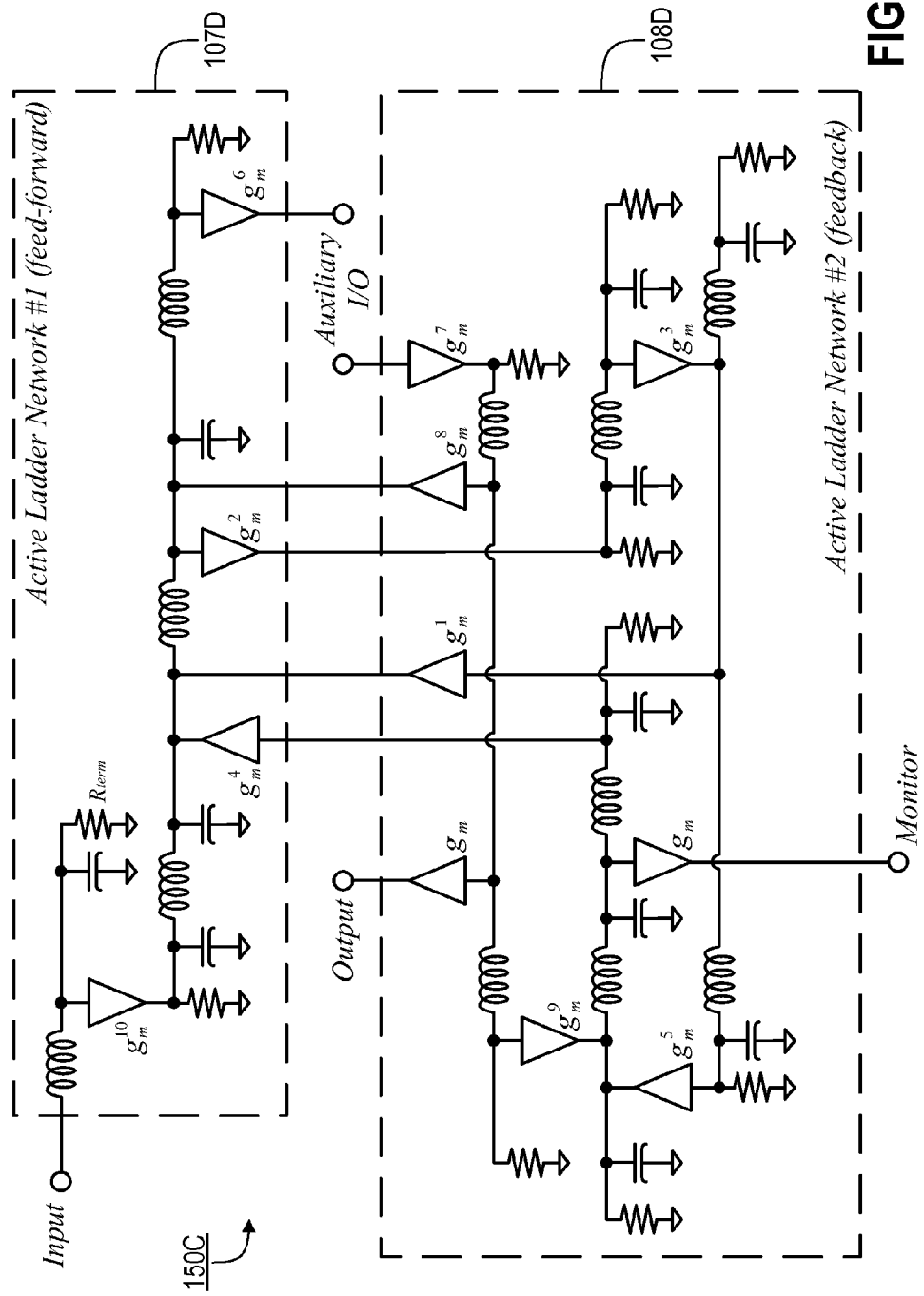
FIG. 8D is a block diagram of a second alternate implementation of a distributed modulator that shapes noise and distortion according to a second-order response, and utilizes a plurality of gain cells and reactive impedance segments to form controlled-impedance transmission channels over which propagating signals are delayed in time and scaled in magnitude.

Another alternative exemplary modulator, according to the preferred embodiments of the present invention, is distributed modulator 150C shown in FIG. 8D. The functionality of exemplary modulator 150C is similar to that of exemplary modulators 150A&B. Compared to exemplary modulators 150A&B, however, the active ladder networks of modulator 150C form artificial transmission lines with shunt capacitance (discrete or intrinsic), instead of series inductance, as the first reactive element. The arrangement of circuit 150C can be advantageous in terms of utilized area, because such a distributed modulator can be implemented using a fewer number of inductors. Exemplary modulator 150C comprises 11 discrete inductors, as opposed to exemplary modulators 150A&B which respectively comprise 14 and 19 discrete inductors, respectively.

Figure 9A:
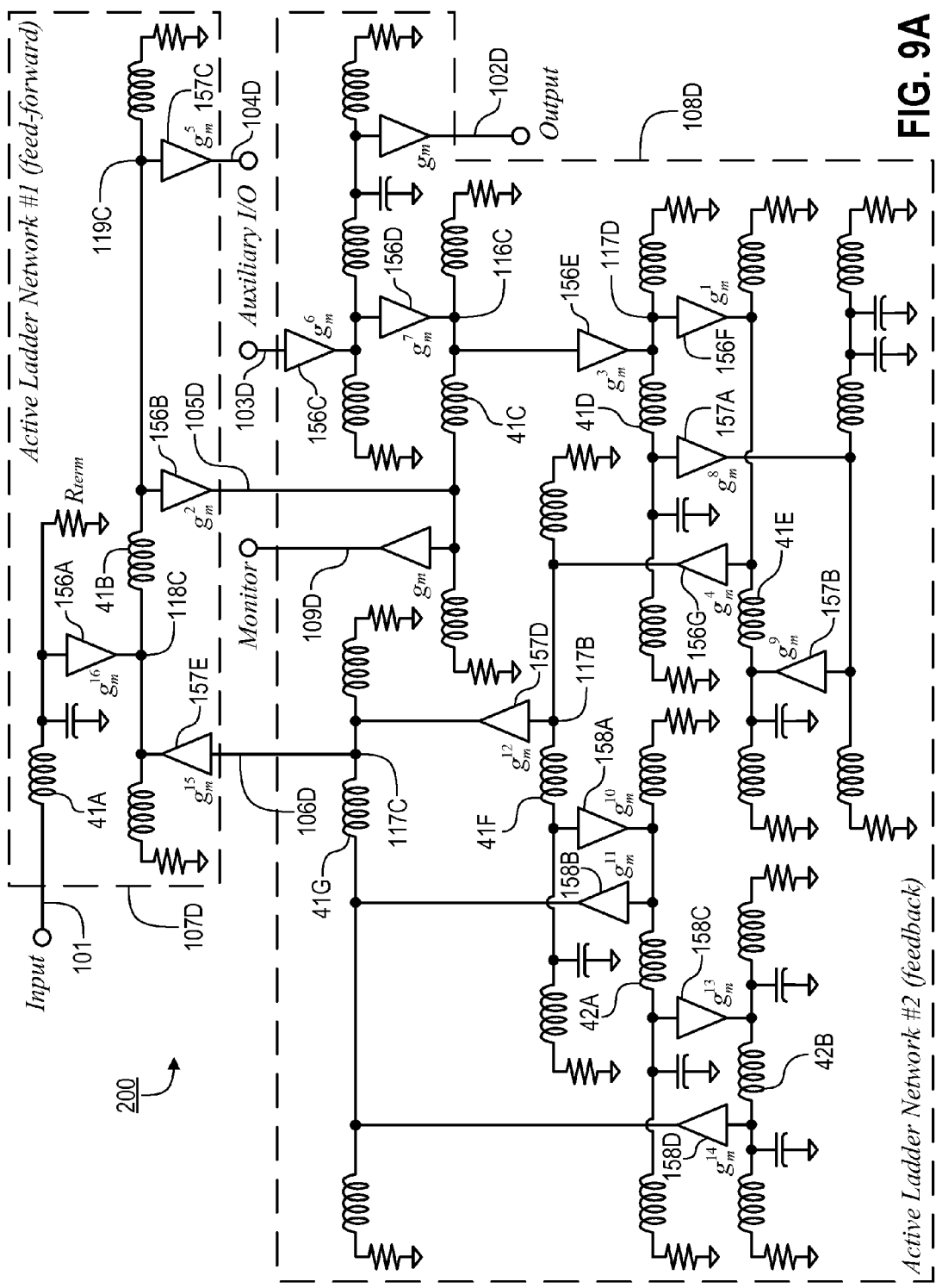
FIG. 9A is a block diagram of an exemplary implementation of a distributed modulator that shapes noise and distortion according to a fourth-order response, and utilizes a plurality of gain cells and reactive impedance segments to form controlled-impedance transmission channels over which propagating signals are delayed in time and scaled in magnitude.

A distributed modulator, which uses active ladder networks to shape noise with a fourth-order response, is circuit 200 shown in FIG. 9A. Distributed modulator 200 includes: 1) an input line for receiving input signal 101; 2) an output line for providing output signal 102D; 3) a monitor line for providing error signal 109D; and 4) two auxiliary lines for receiving quantized signal 103D and providing continuously-variable signal 104D. Exemplary modulator 200 is similar to exemplary modulator 150B in that all of the reactive impedance segments are grouped into artificial transmission lines having two L-sections (i.e., with two associated junction points), and the total shunt capacitance for each of the L-sections is equal (i.e., each L-section contains two capacitive elements as gain cells and/or discrete capacitors). As illustrated in FIG. 9A, the reactive impedance segments comprising modulator 200 are grouped into a total of 10 artificial transmission lines. At junction point 116C, a continuously-variable version of input signal 101 (i.e., a version of signal 101 produced by magnitude scaling and time delaying through a transmission channel which includes gain cells 156A&B and inductors 41A-C) is merged with a quantized version of input signal 101 (i.e., via coupling of signal 103D through gain cells 156C&D). Preferably, the continuously-variable and quantized signals are merged with opposite phases, such that: 1) the merged signal is the difference between the quantized signal and the continuously-variable signal; and 2) the merged signal emulates the noise and distortion introduced by the sampling/quantization operation of the external (auxiliary) device. From junction point 116C, the merged signal (i.e., error signal) is distributed between two controlled-impedance transmission channels: 1) a first transmission channel that establishes a first feedback path, and over which the merged signal is coupled to junction point 117B through gain cells 156E-G; and 2) a second transmission channel that establishes a second feedback path, and over which the merged signal is coupled to junction point 117B through gain cells 156E&G, gain cells 157A&B, and inductors 41D&E. At junction point 117B, the signal that propagates over the first transmission channel is combined with the signal that propagates over the second transmission channel to form a first composite signal. The first composite signal is then coupled to central junction point 118C through gain cells 157D&E, and also is distributed between two additional controlled-impedance transmission channels: 1) a third transmission channel that establishes a third feedback path, and over which the first composite signal is coupled to intermediate junction point 117C through gain cells 158A&B and inductor 41F&G; and 2) a fourth transmission channel that establishes a fourth feedback path, and over which the first composite signal is coupled to intermediate junction point 117C through gain cell 158A, gain cells 158C&D, inductors 41F&G, and inductors 42A&B. At intermediate junction point 117C, the signal that propagates over the third transmission channel is combined with the signal that propagates over the fourth transmission channel to form a second composite signal, which is coupled to central junction point 118C through gain cell 157E. Finally, the first composite signal (i.e., the combination of the signals propagating over the first and second transmission channels) and the second composite signal (i.e., the combination of the signals propagating over the third and fourth transmission channels) are combined at central junction point 118C, with a version of input signal 101 that has propagated through inductor 41A and gain cell 156A. Like exemplary modulators 150A&B, modulator 200 includes an output line which provides a quantized signal (e.g., signal 102D), and a monitor line which provides a signal (e.g., signal 109D) emulating the noise and distortion introduced by the sampling/quantization operation of the external (auxiliary) device. In alternate embodiments, however, the output line and/or the monitor line are absent.

Referring to exemplary modulator 200, the configuration of the reactive impedance segments within the second (feedback) active ladder network form four distinct feedback paths, with respect to a continuously-variable signal (e.g., signal 105D) or a quantized signal (e.g., signal 103D). Any continuously-variable signals traversing the first feedback path (i.e., the path from node 118C back to node 118C through the first controlled-impedance transmission channel of network 108D) are subjected to time delaying which is equal to the propagation delay of two reactive impedance segments: 1) the delay of the L-section formed by discrete inductor 41B and the intrinsic (input) capacitance of gain cells 156B and 157C; and 2) the delay of the L-section formed by discrete inductor 41C, the intrinsic (input) capacitance of gain cell 156E, and the intrinsic (output) capacitance of gain cell 156D. By comparison, any continuously-variable signals traversing the second feedback path are subjected to time delaying which is equal to the propagation delay of four reactive impedance segments (i.e., the delay from a total of four L-sections). The second feedback path (i.e., the path from node 118C back to node 118C) is traversed by continuously-variable signals through one of two modes: 1) a compound mode which includes the first and third controlled-impedance channels of network 108D, such that signals pass in sequential order through gain cells 156B, 156E-G, 158A&B, and 157E; and 2) a simple mode which includes the second controlled-impedance channel of network 108D, such that signals pass in sequential order through gain cells 156B&E, 157A&B, 156G, and 157D&E. A delay equal to the propagation delay of six reactive impedance segments (i.e., the delay from a total of six L-sections) is introduced to any continuously-variable signals which traverse the third feedback path through either of two compound modes: 1) a first compound mode which includes the first and fourth controlled-impedance channels of network 108B, such that signals pass in sequential order through gain cells 156B, 156E-G, 158A, 158C&D, and 157E; and 2) a second compound mode which includes the second and third fourth controlled-impedance channels of network 108D, such that signals pass in sequential order through gain cells 156B&E, 157A&B, 156G, 158A&B, and 157E. Finally, continuously-variable signals traversing a fourth feedback path, which includes the second and fourth controlled-impedance channels of network 108D, are subjected to a time delay equal to the propagation delay of eight reactive impedance segments (i.e., the delay from a total of eight L-sections), as they pass in sequential order through gain cells 156B&E, 157A&B, 156G, 158A, 158C&D, and 157E. The time delaying produced by any one of these four distinct feedback paths, differs from that produced by any of the other distinct feedback paths, by an amount which equals or exceeds the propagation delay of two reactive impedance segments (e.g., the time delay difference between the first and second feedback paths is the propagation delay of two L-sections, the time delay difference between the third and fourth feedback paths is the propagation delay of two L-sections, the time delay difference between the first and fourth feedback paths is the propagation delay of six L-sections, etc.). In general, the time delay resulting from traversing any one distinct feedback path, preferably differs from the time delay resulting from traversing any other distinct feedback path, by an amount which equals or exceeds the minimum propagation delay associated with any of the reactive impedance segments (i.e., the smallest propagation delay of any of the L-sections comprising the first or second active ladder networks). Those skilled in the art will readily appreciate that in the exemplary embodiment of modulator 200, quantized signals (e.g., signal 103D) similarly transverse four feedback paths, which subject signals to time delaying that differs by an amount equaling or exceeding the propagation delay of two reactive impedance segments.

Referring again to exemplary modulator 200, the transconductances of the gain cells preferably configured such that the overall filtering $H_C(s)$ applied to the continuously-variable version of the input signal (i.e., as part of a merged signal traversing the first, second, third, and fourth feedback paths) is given by:

$$H_C(s) = 2 \cdot H_{FBK1}(s) + 2 \cdot H_{FBK2}(s) + H_{FBK1}(s) \cdot H_{FBK3}(s) + H_{FBK1}(s) \cdot H_{FBK4}(s) + H_{FBK2}(s) \cdot H_{FBK3}(s) + H_{FBK2}(s) \cdot H_{FBK4}(s)$$

$$= 2 \cdot (\varphi_{00} \cdot W_{00}(s) + \varphi_{01} \cdot W_{01}(s)) + \varphi_{00} \cdot W_{00}(s) \cdot \varphi_{02} \cdot W_{02}(s) + \varphi_{00} \cdot W_{00}(s) \cdot \varphi_{03} \cdot W_{03}(s) + \varphi_{01} \cdot W_{01}(s) \cdot \varphi_{02} \cdot W_{02}(s) + \varphi_{01} \cdot W_{01}(s) \cdot \varphi_{03} \cdot W_{03}(s)$$

$$= (\varphi_{00} \cdot W_{00}(s) + \varphi_{01} \cdot W_{01}(s)) \cdot (2 + \varphi_{02} \cdot W_{02}(s) + \varphi_{03} \cdot W_{03}(s))$$

where $H_{FBKj}(s) = \phi_{0j} \cdot W_{0j}(s)$ is the aggregate filtering applied to the continuously-variable version of the input signal passing through the $(j-1)^{th}$ feedback path of the modulator (i.e., a combination of filtering by reactive impedance segments within the first and second active ladder networks). Similarly, the overall filtering $H_Q(s)$ applied to the quantized version of the input signal (i.e., as part of a merged signal traversing the first, second, third, and fourth feedback paths) is given by:

$$H_Q(s) = 2 \cdot H'_{FBK1}(s) + 2 \cdot H'_{FBK2}(s) + H'_{FBK1}(s) \cdot H'_{FBK3}(s) + H'_{FBK1}(s) \cdot H'_{FBK4}(s) + H'_{FBK2}(s) \cdot H'_{FBK3}(s) + H'_{FBK2}(s) \cdot H'_{FBK4}(s)$$

$$= 2 \cdot (\varphi_{10} \cdot W_{10}(s) + \varphi_{11} \cdot W_{11}(s)) + \varphi_{10} \cdot W_{10}(s) \cdot \varphi_{12} \cdot W_{12}(s) + \varphi_{10} \cdot W_{10}(s) \cdot \varphi_{13} \cdot W_{13}(s) + \varphi_{11} \cdot W_{11}(s) \cdot \varphi_{12} \cdot W_{12}(s) + \varphi_{11} \cdot W_{11}(s) \cdot \varphi_{13} \cdot W_{13}(s)$$

$$= (\varphi_{10} \cdot W_{10}(s) + \varphi_{11} \cdot W_{11}(s)) \cdot (2 + \varphi_{12} \cdot W_{13}(s) + \varphi_{13} \cdot W_{13}(s))$$

where $H'_{FBKj}(s) = \phi_{1j} \cdot W_{1j}(s)$ is the aggregate filtering applied to the quantized version of the input signal passing through the $(j-1)^{th}$ feedback path of the modulator (i.e., a combination of filtering by reactive impedance segments within the first and second active ladder networks). In the preferred embodiments of exemplary modulator 200, the transconductances of the gain cells and the transfer functions of the reactive impedance segments (i.e., L-sections) are configured such that: 1) the aggregate filtering applied to a signal traversing the first feedback path is equivalent, but not necessarily identical, to the additional (residual) filtering applied by the third transmission channel of network 108D; and 2) the aggregate filtering applied to a signal traversing the second feedback path is equivalent, but not necessarily identical, to the additional (residual) filtering applied by the fourth transmission channel of network 108D. In alternate embodiments, however, the aggregate filtering through the first feedback path is different from the residual filtering applied by the third transmission channel, and the aggregate filtering applied through the second feedback path is different from the residual filtering applied by the fourth transmission channel. In any event, when modulator 200 is configured for operation as a DPL according to the preferred embodiments (i.e., the preferred filtering by the first feedback path, the second feedback path, the third transmission channel, and the fourth transmission channel), the overall filtering $H_e(s)$ applied to the continuously-variable version of the input signal (i.e., as part of a merged signal traversing the first, second, third, and fourth feedback paths) is given by $$H_C(s) = H_1(s) \cdot H_3(s) \cdot [2 + H_1(s) \cdot H_3(s)],$$

and the overall filtering $H_Q(s)$ applied to the quantized version of the input signal (i.e., as part of a merged signal traversing the first, second, third, and fourth feedback paths) is given by $$H_Q(s) = H_2(s) \cdot H_3(s) \cdot [2 + H_2(s) \cdot H_3(s)],$$

where $H_1(s) \cdot H_3(s) = \phi_{00} \cdot W_{00}(s) + \phi_{01} \cdot W_{01}(s)$ and $H_2(s) \cdot H_3(s) = \phi_{10} \cdot W_{10}(s) + \phi_{11} \cdot W_{11}(s)$. This results in a signal-transfer-function (STF) that is approximately all-pass, and a noise-transfer function (NTF) with a fourth-order response that is given by:

$$NTF(s) = \frac{1 + H_1(s) \cdot H_3(s) \cdot (2 + H_1(s) \cdot H_3(s))}{1 + H_1(s) \cdot H_3(s) \cdot (2 + H_1(s) \cdot H_3(s)) - H_2(s) \cdot H_3(s) \cdot (2 + H_2(s) \cdot H_3(s))}.$$

Figure 9B:
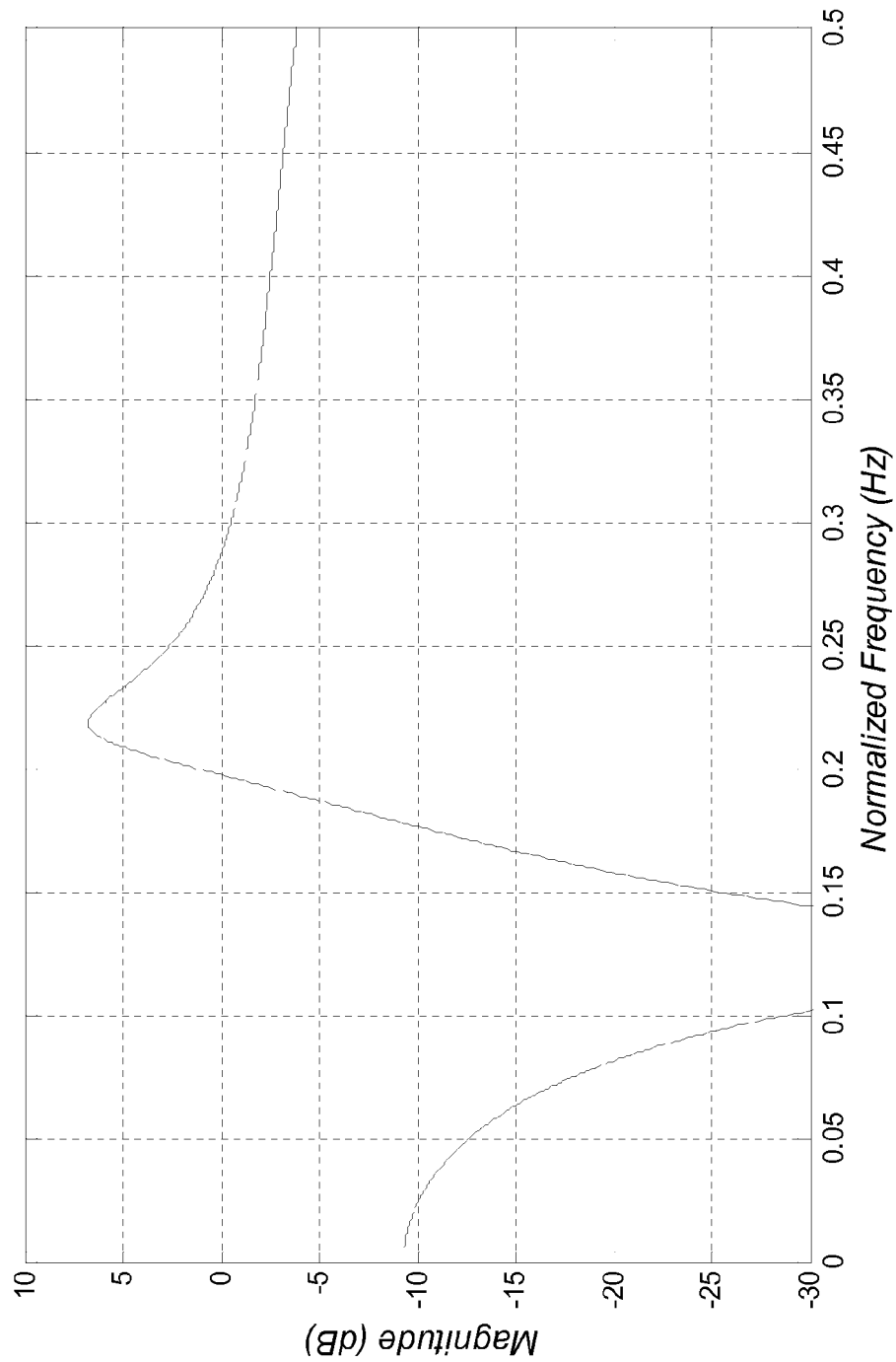
FIG. 9B is a graph showing the magnitude response of an exemplary noise-transfer-function for a fourth-order DPL, which utilizes a distributed modulator according to the preferred embodiments of the invention.

FIG. 9B is a diagram showing the NTF response of a fourth-order DPL with all-pass filter responses $W_{ij}(s)$, which has been configured through loop parameters $\phi_{ij}$ (i.e., $\phi_{00} = \phi_{10} = -1.414$ and $\phi_{01} = \phi_{11} = 1$) to produce a spectral null at a normalized frequency (i.e., $t_{PD} = 0.5$) of 0.125 Hertz.

It should be noted that for a distributed modulator according to the preferred embodiments of the invention, a continuously-variable version of an input signal and a quantized version of an input signal are fed back to a first active ladder network (i.e., within which the fed-back signals are combined with a signal coupled from the modulator input), either as separate signals or as a merged (i.e., error) signal, through a number of distinct feedback paths (i.e., through either simple or compound modes) which is equal to or greater than the desired order of the noise-shaped response. The time delay introduced to signals traversing one distinct feedback path is different from the time delay introduced to signals traversing another distinct feedback path, by an amount which equals or exceeds the minimum propagation delay associated with any of the reactive impedance segments (i.e., the smallest propagation delay associated with any of the L-sections within the first or second active ladder network). Although the exemplary embodiments discussed above employ either two distinct feedback paths and second-order shaping, or four distinct feedback paths and fourth-order shaping, distributed modulators having a different number of feedback paths and noise-shaped responses of different order, should be considered within the scope of the invention.

Additional Considerations

As used herein, the term "coupled", or any other form of the word, is intended to mean either directly connected or connected through one or more other elements, such as reactive impedance segments, gain cells, or other processing blocks.

In the preceding discussion, the terms "operators", "operations", "functions" and similar terms can refer to method steps or hardware components, depending upon the particular implementation/embodiment.

In the event of any conflict or inconsistency between the disclosure explicitly set forth herein or in the attached drawings, on the one hand, and any materials incorporated by reference herein, on the other, the present disclosure shall take precedence. In the event of any conflict or inconsistency between the disclosures of any applications or patents incorporated by reference herein, the disclosure having the most recent priority date shall take precedence.

Unless clearly indicated to the contrary, words such as "optimal", "optimize", "minimize", "best", as well as similar words and other words and suffixes denoting comparison, in the above discussion are not used in their absolute sense. Instead, such terms ordinarily are intended to be understood in light of any other potential constraints, such as user-specified constraints and objectives, as well as cost and processing constraints.

References herein to a "criterion", "multiple criteria", "condition", "conditions" or similar words which are intended to trigger, limit, filter or otherwise affect processing steps, other actions, the subjects of processing steps or actions, or any other activity or data, are intended to mean "one or more", irrespective of whether the singular or the plural form has been used. For instance, any criterion or condition can include any combination (e.g., Boolean combination) of actions, events and/or occurrences (i.e., a multi-part criterion or condition).

In the discussions above, the words "include", "includes", "including", and all other forms of the word should not be understood as limiting, but rather any specific items following such words should be understood as being merely exemplary.

Several different embodiments of the present invention are described above, with each such embodiment described as including certain features. However, it is intended that the features described in connection with the discussion of any single embodiment are not limited to that embodiment but may be included and/or arranged in various combinations in any of the other embodiments as well, as will be understood by those skilled in the art.

Similarly, in the discussion above, functionality sometimes is ascribed to a particular module or component. However, functionality generally may be redistributed as desired among any different modules or components, in some cases completely obviating the need for a particular component or module and/or requiring the addition of new components or modules. The precise distribution of functionality preferably is made according to known engineering tradeoffs, with reference to the specific embodiment of the invention, as will be understood by those skilled in the art.

Thus, although the present invention has been described in detail with regard to the exemplary embodiments thereof and accompanying drawings, it should be apparent to those skilled in the art that various adaptations and modifications of the present invention may be accomplished without departing from the spirit and the scope of the invention. Accordingly, the invention is not limited to the precise embodiments shown in the drawings and described above. Rather, it is intended that all such variations not departing from the spirit of the invention be considered as within the scope thereof as limited solely by the claims appended hereto.

What is claimed is:

1. A distributed modulator for shaping the noise and distortion of an external sampling/quantization device, said modulator comprising:
    an input line for receiving an input signal that is continuous in time and in value;
    a first auxiliary line for providing a magnitude-scaled and time-delayed version of said input signal to an external sampling/quantization device;
    a second auxiliary line for receiving a quantized signal from the external sampling/quantization device;
    a first active ladder network having a first input coupled to the input line, a second input, a first output coupled to the first auxiliary line, and a second output; and
    a second active ladder network having a first input coupled to the second output of the first active ladder network, a second input coupled to the second auxiliary line, and an output coupled the second input of the first active ladder network,
    wherein each of the first and second active ladder networks includes a plurality of reactive impedance segments and a plurality of gain cells, which are grouped to form one or more controlled-impedance transmission channels, and with each said reactive impedance segment including: (a) at least one series inductive element, (b) a least one shunt capacitive element, and (c) a junction point to which the inductive element and capacitive element are coupled, and
    wherein each of the plurality of gain cells further includes: (a) an active device, (b) an input terminal coupled to a junction point of a first reactive impedance segment, and (c) an output terminal coupled to a junction point of a second reactive impedance segment.

2. The modulator according to claim 1, further comprising a monitor line for providing an error signal that emulates noise and distortion present within said quantized signal.

3. The modulator according to claim 2, wherein the monitor line is input to a second modulator stage according to a multi-stage (noise) shaping (MASH) configuration.

4. The modulator according to claim 1, wherein said plural controlled-impedance transmission channels of said second active ladder network establish plural feedback paths.

5. The modulator according to claim 4, wherein the total number of said feedback paths equal or exceed an order of the noise-shaping response of said apparatus.

6. The modulator according to claim 4, wherein the time delay through each of the feedback paths differs from the time delay through each other of the feedback paths by an amount equaling or exceeding the minimum propagation delay associated with said reactive impedance segments.

7. The modulator according to claim 4, wherein said second active ladder network also includes an output line for providing a filtered version of said quantized signal, and wherein unwanted noise and distortion on said output line has been filtered according to a band-stop response with an order that depends on the number of feedback paths.

8. The modulator according to claim 7, wherein said apparatus includes at least two distinct feedback paths and the noise-shaped response is second-order.

9. The modulator according to claim 7, wherein said apparatus includes at least four feedback paths and the noise-shaped response is fourth-order.

10. The modulator according to claim 9, wherein the response of a controlled-impedance transmission channel, as a partial response of one feedback path, is equivalent to the complete response of a second feedback path, with respect to at least one of a time delay or a magnitude scaling.

11. The modulator according to claim 1, wherein the transfer function from said input line to said first auxiliary line is approximately all-pass over a specified input signal operating bandwidth.

12. The modulator according to claim 1, wherein each of the reactive impedance segments has a low-pass corner frequency that is equal to or greater than the maximum operating frequency of said apparatus.

13. The modulator according to claim 1, wherein at least one of the reactive impedance segments has a low-pass corner frequency that is less than a maximum operating frequency of said apparatus.

14. The modulator according to claim 1, wherein said reactive impedance segments have equivalent frequency responses with respect to at least one of magnitude or delay.

15. The modulator according to claim 1, wherein at least one reactive impedance segment has a frequency response that is different from the frequency response of another reactive impedance segment, in at least one of magnitude or delay.

16. The modulator according to claim 1, wherein at least one of said gain cells includes a variable gain control.

17. The modulator according to claim 16, wherein said variable gain control determines a location of a spectral minimum in the frequency response of the noise-transfer-function of said apparatus.

18. The modulator according to claim 1, wherein the reactive impedance segments of said second active ladder network are concatenated to create a set of the controlled-impedance transmission channels, having distinct magnitude and delay responses, and through which said composite signal and said quantized signal propagate.

19. The modulator according to claim 1, wherein said second active ladder network combines signals that propagate over said controlled-impedance transmission channels to generate the output of said second active ladder network.

20. The modulator according to claim 1, wherein said first active ladder network combines said input signal with the output of said second active ladder network, over one of the controlled-impedance transmission channels, to generate a composite signal that is continuous in value and is delayed in time by at least a minimum propagation delay associated with the reactive impedance segments within said first active ladder network.

* * * * *